United States Patent
Yamaguchi

(10) Patent No.: US 11,632,035 B2
(45) Date of Patent: Apr. 18, 2023

(54) CAPACITOR DIAGNOSIS DEVICE AND CAPACITOR DIAGNOSIS METHOD

(71) Applicant: TOSHIBA MITSUBISHI-ELECTRIC INDUSTRIAL SYSTEMS CORPORATION, Chuo-ku (JP)

(72) Inventor: Haruyuki Yamaguchi, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 17/265,979

(22) PCT Filed: Jul. 24, 2019

(86) PCT No.: PCT/JP2019/028983
§ 371 (c)(1),
(2) Date: Feb. 4, 2021

(87) PCT Pub. No.: WO2021/014604
PCT Pub. Date: Jan. 28, 2021

(65) Prior Publication Data
US 2022/0137155 A1     May 5, 2022

(51) Int. Cl.
*H02M 1/32*     (2007.01)
*G01R 31/64*    (2020.01)
*H02M 7/48*     (2007.01)

(52) U.S. Cl.
CPC .............. *H02M 1/32* (2013.01); *G01R 31/64* (2020.01); *H02M 7/48* (2013.01)

(58) Field of Classification Search
CPC ..... G01R 31/00; G01R 27/26; G01R 27/2694
See application file for complete search history.

(56) References Cited

U.S. PATENT DOCUMENTS

2007/0068266 A1* 3/2007 Fujimori ............... G01L 27/007
                                                         73/724
2011/0241695 A1* 10/2011 Younsi ................... G01R 31/64
                                                         324/548

(Continued)

FOREIGN PATENT DOCUMENTS

CN     104515917 A    4/2015
JP     2011-55590 A   3/2011

(Continued)

OTHER PUBLICATIONS

Office Action dated Mar. 7, 2022, in corresponding Indian Patent Application No. 202017049135 (with English Translation), 7 pages.

(Continued)

*Primary Examiner* — Jermele M Hollington
*Assistant Examiner* — Temilade S Rhodes-Vivour
(74) *Attorney, Agent, or Firm* — Oblon, McClelland, Maier & Neustadt, L.L.P.

(57) ABSTRACT

According to an embodiment, a capacitor diagnosis device includes a sensor, a frequency spectrum analysis unit, a frequency component extraction unit, and a diagnosis processing unit. The sensor detects a physical quantity that changes with an current flowing through a capacitor in a power conversion unit (PCU) for converting DC power smoothed by the capacitor connected in parallel to DC link(s) into AC power according to a power running operation. The frequency spectrum analysis unit generates a frequency spectrum based on a detection result of the sensor detected during the power running operation of the PCU. The frequency component extraction unit extracts a component of a specific frequency band related to a frequency depending on a configuration of the PCU based on the frequency spectrum. The diagnosis processing unit diagno- (Continued)

ses a state of the capacitor based on at least a magnitude of the extracted component of the specific frequency band.

14 Claims, 13 Drawing Sheets

(56) References Cited

U.S. PATENT DOCUMENTS

| | | | | |
|---|---|---|---|---|
| 2013/0155729 | A1* | 6/2013 | Lee | H02P 29/032 |
| | | | | 363/37 |
| 2016/0274181 | A1* | 9/2016 | Aoyama | G01C 19/5776 |
| 2017/0292984 | A1* | 10/2017 | Nakao | G01R 31/64 |
| 2017/0310235 | A1* | 10/2017 | Sakakibara | H02M 5/4585 |

FOREIGN PATENT DOCUMENTS

| | | |
|---|---|---|
| JP | 2018-191446 A | 11/2018 |
| WO | WO 2019/239511 A1 | 12/2019 |

OTHER PUBLICATIONS

Japanese Office Action dated Aug. 4, 2020 in Japanese Patent Application No. 2019-569496 (with unedited computer generated English translation), 6 pages.
International Search Report dated Oct. 15, 2019 in PCT/JP2019/028983 filed on Jul. 24, 2019, 2 pages.

* cited by examiner

US 11,632,035 B2

CAPACITOR DIAGNOSIS DEVICE AND CAPACITOR DIAGNOSIS METHOD

TECHNICAL FIELD

Embodiments of the present invention relate to a capacitor diagnosis device and a capacitor diagnosis method.

BACKGROUND ART

A power conversion device including a capacitor (a condenser) for smoothing a voltage related to direct current (DC) power and configured to generate alternating current (AC) power on the basis of the DC power is known. Although a capacitor is one of components having a life, the deterioration of a capacitor may not be easily detected.

CITATION LIST

Patent Literature

[Patent Literature 1]
Japanese Unexamined Patent Application, First Publication No. 2018-191446

SUMMARY OF INVENTION

Technical Problem

An objective of the present invention is to provide a capacitor diagnosis device and a capacitor diagnosis method capable of easily detecting deterioration of a capacitor.

Solution to Problem

According to an embodiment, a capacitor diagnosis device includes a sensor, a frequency spectrum analysis unit, a frequency component extraction unit, and a diagnosis processing unit. The sensor detects a physical quantity that changes with an electric current flowing through a capacitor in a power conversion unit for converting DC power smoothed by the capacitor connected in parallel to a DC link into AC power according to a power running operation. The frequency spectrum analysis unit generates a frequency spectrum based on a detection result of the sensor detected during the power running operation of the power conversion unit. The frequency component extraction unit extracts a component of a specific frequency band related to a frequency depending on a configuration of the power conversion unit on the basis of the frequency spectrum. The diagnosis processing unit diagnoses a state of the capacitor on the basis of at least a magnitude of the extracted component of the specific frequency band.

DESCRIPTION OF EMBODIMENTS

Hereinafter, a capacitor diagnosis device and a capacitor diagnosis method of embodiments will be described with reference to the drawings. In the following description, components having the same or similar functions are denoted by the same reference signs.

A "connection" mentioned in the description is not limited to a physical connection and also includes an electrical connection. In the present description, a frequency of an AC fundamental wave is referred to as a fundamental frequency.

First Embodiment

First, a power conversion system 2 including the capacitor diagnosis device of the embodiment will be described.

Figure 1:
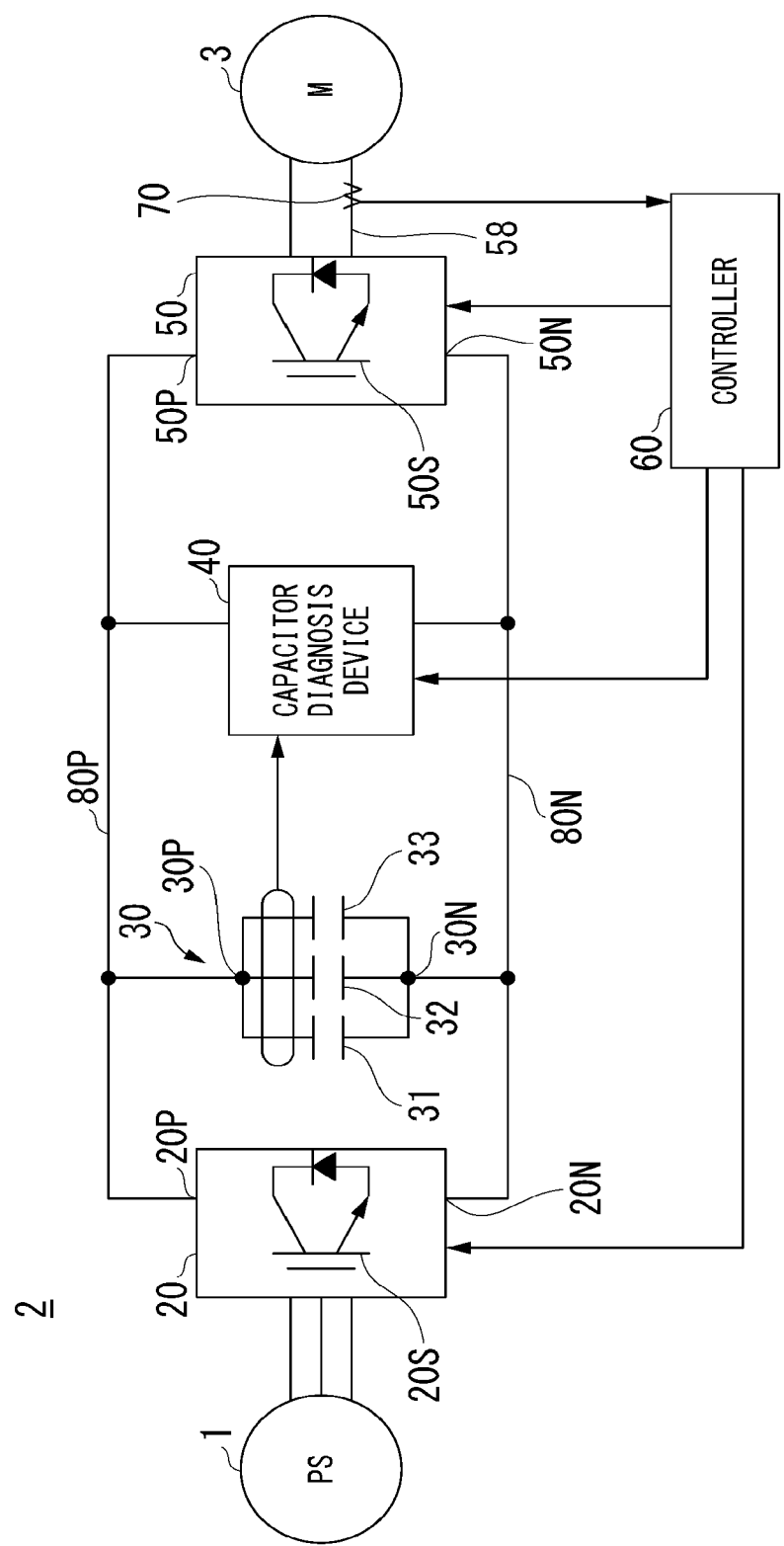
FIG. 1 is a configuration diagram of a power conversion system according to a first embodiment.

FIG. 1 is a configuration diagram showing the power conversion system 2 according to the first embodiment. An AC power supply 1, the power conversion system 2, and an electric motor 3 are shown in FIG. 1.

The AC power supply 1 is a commercial power supply system (PS), a power generator, or the like, and supplies, for example, three-phase AC power to the power conversion system 2.

The electric motor 3 is, for example, an AC variable speed motor (M) such as an induction motor. The electric motor 3 is driven by the AC power supplied from the power conversion system 2, outputs a rotational driving force to an output shaft (not shown), and drives a load connected to the output shaft using the rotational driving force.

The power conversion system 2 converts AC power supplied from the AC power supply 1 into DC power, inversely converts DC power into AC power, and supplies the single-phase AC power obtained by the inverse conversion to the electric motor 3. The present invention is not limited thereto and the power conversion system 2 may supply the electric motor 3 with three-phase AC power if the electric motor 3 is of a three-phase AC type. In the following description, a case in which the electric motor 3 is of a single-phase AC type will be described as an example.

The power conversion system 2 includes, for example, a rectifier 20, a capacitor 30, a capacitor diagnosis device 40, an inverter 50, a controller 60, and a load current detector 70.

The rectifier 20 includes a positive electrode output terminal 20P and a DC-side output negative electrode terminal 20N in addition to an AC-side terminal connected to the AC power supply 1. The positive electrode output terminal 20P is connected to a first end of a positive electrode line 80P. A second end of the positive electrode line 80P is connected to a positive electrode input terminal 50P of the inverter 50. The DC-side output negative electrode terminal 20N is connected to a first end of the negative electrode line 80N. A second end of the negative electrode line 80N is connected to a negative electrode input terminal 50N of the inverter 50.

For example, the rectifier 20 includes one or more switching devices 20S such as insulated gate bipolar transistors (IGBTs). The switching device 20S is controlled by the controller 60 such that a DC voltage on the output side of the rectifier 20 becomes a desired voltage. The rectifier 20 outputs DC power after conversion from the positive electrode output terminal 20P and the DC-side output negative electrode terminal 20N to the positive electrode line 80P and the negative electrode line 80N.

The capacitor 30 is connected in parallel to the positive electrode line 80P and the negative electrode line 80N and smooths the DC power output by the rectifier 20. The capacitor 30 includes a plurality of capacitor units connected in parallel to each other in a DC manner. A capacitor unit 31 (a first capacitor unit), a capacitor unit 32 (a second capacitor unit), and a capacitor unit 33 are examples of the plurality of capacitor units. The capacitor 30 includes a positive electrode branch terminal 30P connected to the positive electrode line 80P and a negative electrode branch terminal 30N connected to the negative electrode line 80N.

For example, positive electrode sides of the capacitor units 31, 32, and 33 are connected to the positive electrode line 80P via the positive electrode branch terminal 30P. Likewise, negative electrode sides of the capacitor units 31, 32, and 33 are connected to the negative electrode line 80N via the negative electrode branch terminal 30N. The above-described connection form is an example of a form in which the capacitor units 31, 32, and 33 are connected in parallel to each other in a DC manner.

The type of the capacitor 30 may be, for example, an electrolytic capacitor, a film capacitor, or the like. Types of the capacitor units 31, 32, and 33 may be the same as each other and capacitances of the capacitor units 31, 32, and 33 may be the same as each other. Each of the capacitor units 31, 32, and 33 are referred to as a capacitor unit.

The capacitor diagnosis device 40 detects an electric current flowing through each capacitor unit during the power running operation of the power conversion system 2, extracts an electric current component of a specific frequency band from a frequency spectrum based on a detected electric current value, and diagnoses a state of each capacitor unit on the basis of a magnitude of the extracted electric current component of the specific frequency band. For example, the above-described specific frequency band includes a frequency band related to a frequency depending on the configuration of the inverter 50 to be described below. This will be described below.

The inverter 50 is, for example, a single-phase inverter including one or more switching devices 50S such as an IGBT. The type of the switching device 50S may be changed to another type without being limited to an IGBT. The switching device 50S of the inverter 50 is pulse width modulation (PWM)-controlled by the controller 60. The inverter 50 converts, for example, DC power supplied from the rectifier 20 via the positive electrode line 80P and the negative electrode line 80N into single-phase AC power. The inverter 50 supplies the single-phase AC power after the conversion to the electric motor 3 via the load power line 58.

The load current detector 70 detects an electric current flowing through the load power line 58 for supplying electric power from the inverter 50 to the electric motor 3.

The controller 60 outputs a gate pulse signal based on PWM control to the switching device 50S of the inverter 50 during the power running operation according to feedback control based on a detected value of the load current detector 70 that detects a load current flowing through the load power line 58 or the like. Thereby, the controller 60 performs the PWM control on the switching device 50S. For example, the controller 60 uses a carrier signal of a carrier frequency fixed to a specific frequency for the PWM control.

For example, the controller 60 may supply the capacitor diagnosis device 40 with information indicating an operation state of the inverter 50, a detected value of the load current detector 70, and the like by communicating with the capacitor diagnosis device 40. The information indicating the operation state of the inverter 50 may be, for example, information indicating that the inverter 50 is in a power running operation state or information indicating a direction in which effective power flows.

Figure 2:
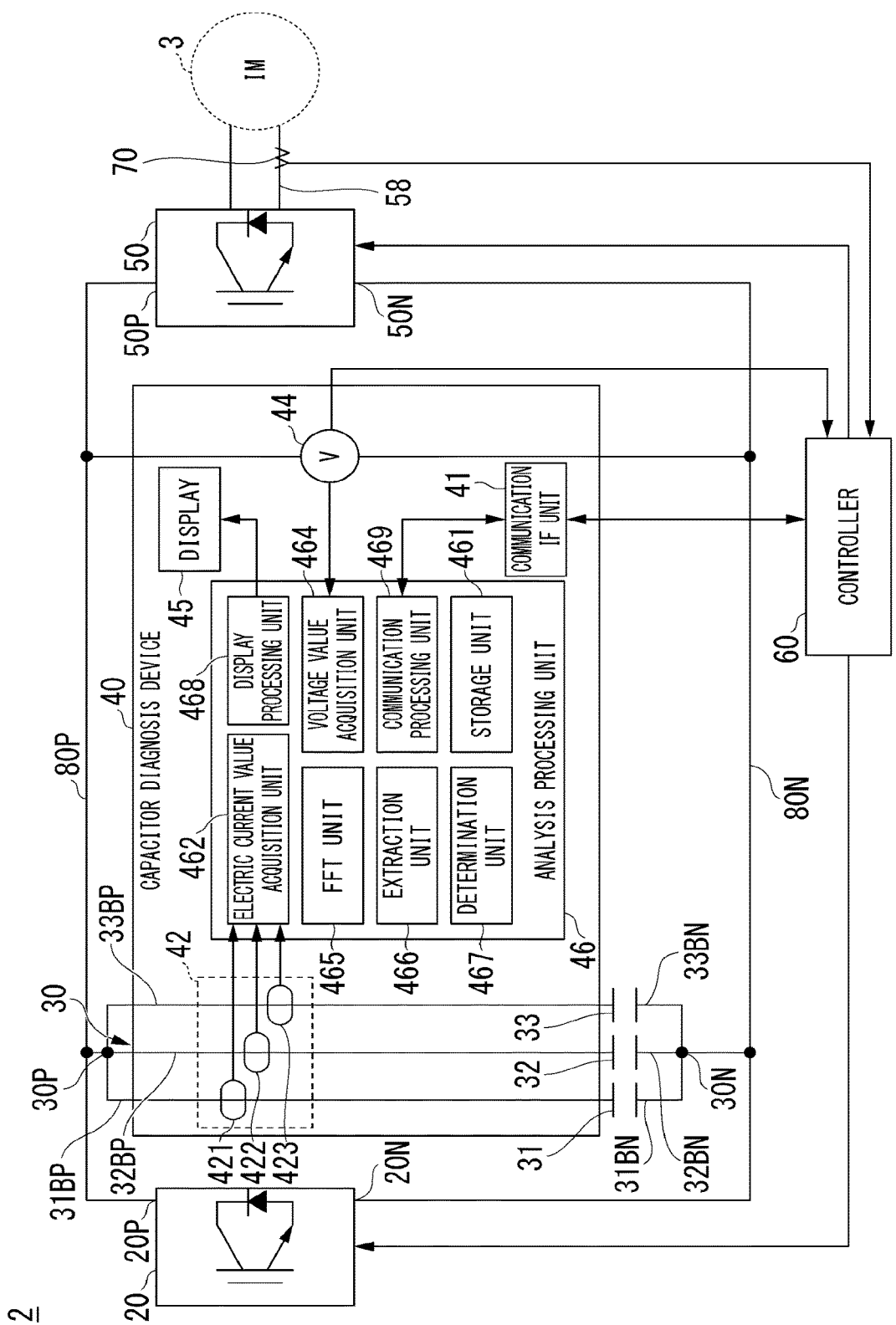
FIG. 2 is a configuration diagram of a capacitor diagnosis device according to the first embodiment.

FIG. 2 is a configuration diagram of the capacitor diagnosis device 40 according to the first embodiment.

The capacitor diagnosis device 40 includes, for example, a communication interface unit 41 (a communication IF unit shown in FIG. 2), an electric current detector 42, a voltage detector 44 (a first voltage sensor), a display 45, and an analysis processing unit 46.

The communication interface unit 41 communicates with a device outside the capacitor diagnosis device 40 according to the control of the analysis processing unit 46 to be described below. For example, the communication interface unit 41 is connected to the controller 60 so that the communication interface unit 41 can communicate with the controller 60 and communicates with the controller 60 according to the control of the analysis processing unit 46 to be described below.

The electric current detector 42 includes a plurality of electric current sensor units. The electric current sensor unit 421 (a first electric current sensor), the electric current sensor unit 422 (a second electric current sensor), and the electric current sensor unit 423 are examples of a plurality of electric current sensor units. When the electric current sensor unit 421, the electric current sensor unit 422, and the electric current sensor unit 423 are collectively described, they are referred to as electric current sensor units 420.

The electric current sensor unit 420 detects an electric current flowing through each of the capacitor units of the capacitor 30 and outputs a detected electric current value indicating the detected electric current to the analysis processing unit 46.

For example, the positive electrode side (a first electrode terminal) of the capacitor unit 31 is connected to the positive electrode branch terminal 30P via a branch line 31BP (a first branch path). The positive electrode side of the capacitor unit 32 is connected to the positive electrode branch terminal 30P via a branch line 32BP (a second branch path). The positive electrode side of the capacitor unit 33 is connected to the positive electrode branch terminal 30P via a branch line 33BP. Likewise, the negative electrode side (a second electrode terminal) of the capacitor unit 31 is connected to the negative electrode branch terminal 30N via a branch line 31BN. The negative electrode side of the capacitor unit 32 is connected to the negative electrode branch terminal 30N via a branch line 32BN. The negative electrode side of the capacitor unit 33 is connected to the negative electrode branch terminal 30N via a branch line 33BN. A connection line from the positive electrode line 80P (a first electrode) to the positive electrode branch terminal 30P and a connection line from the negative electrode line 80N (a second electrode) to the negative electrode branch terminal 30N are examples of branch paths. In other words, a connection line from the positive electrode line 80P (the first electrode) to the positive electrode branch terminal 30P and the branch line 31BP, the branch line 32BP, and the branch line 33BP further branching from the connection line are formed on the positive electrode side of the capacitor unit 31.

In the above-described case, the electric current sensor unit 421 is provided on the branch line 31BP and detects the electric current flowing through the branch line 31BP. The electric current flowing through the branch line 31BP becomes the electric current flowing through the capacitor unit 31. Likewise, the electric current sensor unit 422 is provided on the branch line 32BP and detects an electric current flowing through the branch line 32BP. The electric current flowing through the branch line 32BP becomes an electric current flowing through the capacitor unit 32. The electric current sensor unit 423 is provided on the branch line 33BP and detects an electric current flowing through the branch line 33BP. The electric current flowing through the branch line 33BP becomes an electric current flowing through the capacitor unit 33. Although the above-described example shows a case in which the above-described electric current is detected on the positive electrode side of each capacitor unit, the electric current sensor unit 420 may be provided on the branch line of the negative electrode side to detect the above-described electric current on the negative electrode side of each capacitor unit in place thereof.

The electric current sensor unit 420 may include, for example, a Hall element (not shown), quantize a signal detected by the Hall element using an analog-to-digital (AD) converter (not shown), and output the quantized signal as a detected electric current value indicating an electric current value.

The voltage detector 44 detects a voltage applied between the positive electrode branch terminal 30P and the negative electrode branch terminal 30N and outputs a detected voltage value indicating the voltage to the analysis processing unit 46. The voltage applied between the positive electrode branch terminal 30P and the negative electrode branch terminal 30N is equal to the voltage applied between the positive electrode line 80P and the negative electrode line 80N forming a DC link. Hereinafter, this voltage is referred to as a voltage of the DC link.

The voltage detector 44 detects the voltage of the DC link via, for example, a DC voltage converter whose input and output are insulated, quantizes the voltage of the DC link using the AD converter (not shown), and outputs the quantized voltage as a detected voltage value.

Also, the controller 60 may use the detection result of the voltage detector 44 to stabilize the voltage of the DC link or protect against the voltage of the DC link reaching an overvoltage. For example, the controller 60 may adjust the voltage of the DC link by acquiring the detected value of the DC link voltage from the voltage detector 44 and controlling the rectifier 20.

The display 45 includes a display device such as a liquid crystal display and causes the display device to display desired information according to the control of the analysis processing unit 46 to be described below.

The analysis processing unit 46 diagnoses the state of the capacitor 30 using at least one of a detected electric current value indicating the electric current detected by the electric current detector 42 and a detected voltage value indicating the voltage detected by the voltage detector 44.

For example, the analysis processing unit 46 includes a storage unit 461, an electric current value acquisition unit 462, a voltage value acquisition unit 464, a fast Fourier transform (FFT) unit 465, an extraction unit 466, a determination unit 467, a display processing unit 468, and a communication processing unit 469.

For example, the storage unit 461 stores detected electric current value data indicating an electric current flowing through each capacitor unit acquired by the electric current value acquisition unit 462, electric current value data indicating an electric current flowing between the inverter 50 and the electric motor 3 acquired via the controller 60, detected voltage value data indicating a voltage of a DC link acquired by the voltage value acquisition unit 464, operation state data of the inverter 50, frequency spectrum data generated by the FFT unit 465, extracted frequency component data, a determination criterion data table, a program for a capacitor diagnosis process, and the like. The detected electric current value data, the electric current value data, the detected voltage value data, and the operation state data described above are time-series data. Details of the above-described information will be described below.

Each of the electric current value acquisition unit 462, the voltage value acquisition unit 464, the FFT unit 465, the extraction unit 466, the determination unit 467, the display processing unit 468, and the communication processing unit 469 is implemented, for example, by a hardware processor such as a central processing unit (CPU) executing a program (software). Some or all of these components are implemented, for example, by hardware (a circuit including circuitry) such as large scale integration (LSI), an application specific integrated circuit (ASIC), a field-programmable gate array (FPGA), or a graphics processing unit (GPU) or may be implemented by software and hardware in cooperation. The storage unit 461 is implemented by, for example, a hard disk drive (HDD), a flash memory, an electrically erasable programmable read only memory (EEPROM), a read only memory (ROM), a random access memory (RAM), or the like.

The electric current value acquisition unit 462 acquires a detected electric current value indicating the electric current detected by the electric current sensor unit 420 and adds the detected electric current value to the detected electric current value data of the storage unit 461. Also, detected values indicating a predetermined number of detected electric current values are acquired from the detected electric current value data stored in the storage unit 461 and output to the FFT unit 465. For example, the electric current value acquisition unit 462 refers to the operation state data and supplies the FFT unit 465 with detected values indicating a predetermined number of detected electric current values of a period corresponding to a period in which the inverter 50 is in the operation state among the detected electric current values acquired from the detected electric current value data. Also, the electric current value acquisition unit 462 may perform acquisition of the detected electric current values from the electric current sensor unit 420 and reading of the detected electric current values from the storage unit 461 in parallel.

The voltage value acquisition unit 464 acquires a detected value (a detected voltage value) indicating the voltage of the DC link detected by the voltage detector 44 and adds the detected value to the detected voltage value data in the storage unit 461. Also, detected values indicating a predetermined number of detected voltage values stored in the detected voltage value data of the storage unit 461 are acquired and the detected values are output to the FFT unit 465. For example, the voltage value acquisition unit 464 refers to the operation state data and supplies the FFT unit 465 with detected values indicating a predetermined number of detected voltage values of a period corresponding to a period in which the inverter 50 is in the operation state among detected voltage values acquired from the detected voltage value data. Also, the voltage value acquisition unit 464 may perform acquisition of the detected voltage values from the voltage detector 44 and reading of the detected voltage values from the detected voltage value data of the storage unit 461 in parallel.

The FFT unit 465 generates a frequency spectrum FSi by performing, for example, an FFT process (a fast Fourier transform process) on a predetermined number of detected electric current values received from the electric current value acquisition unit 462, and adds the frequency spectrum FSi to the frequency spectrum data of the storage unit 461. The frequency spectrum FSi obtained by the FFT process indicates a frequency component based on the predetermined number of detected electric current values received from the electric current value acquisition unit 462. The number of detected electric current values received by the FFT unit 465 from the electric current value acquisition unit 462 for the FFT process may be set so that a component of a desired frequency is included in the frequency spectrum FSi obtained by the FFT process.

Also, the FFT unit 465 may perform the FFT process on a predetermined number of detected voltage values received from the voltage value acquisition unit 464. This will be described below.

The extraction unit 466 extracts a component of a specific frequency band related to a frequency depending on a configuration of the inverter 50 from the frequency spectrum FSi generated by the FFT unit 465 and stored in the frequency spectrum data of the storage unit 461 and adds the extracted component as an extracted frequency component $F_{ext1}$ to the extracted frequency component data of the storage unit 461. For example, a component of a frequency 2f, which is twice a carrier frequency f of the PWM control, is an example of an electric current component or a voltage component of a specific frequency band related to a frequency that depends on the configuration of the inverter 50. Also, the fundamental frequency of the inverter 50 and the carrier frequency f may be defined so that an AC fundamental wave frequency and its harmonics generated by the inverter 50 do not interfere with the carrier frequency f of the PWM control and a frequency that is an even multiple of the carrier frequency f (for example, the above-described frequency 2f).

The determination unit 467 determines a magnitude of the extracted frequency component $F_{ext1}$ extracted by the extraction unit 466 and stored in the extracted frequency component data of the storage unit 461 on the basis of a predefined first determination criterion. The first determination criterion will be described below. A determination result of the determination unit 467 includes a result of determining whether or not the deterioration of each capacitor unit has progressed.

The display processing unit 468 causes the display 45 to display the determination result of the determination unit 467. When it is determined that there is a capacitor unit in which deterioration has progressed within the capacitor 30 in the determination result of the determination unit 467, the display processing unit 468 may also cause the display 45 to display the fact that deterioration has progressed with respect to the capacitor 30 including the capacitor unit in which deterioration has progressed.

The communication processing unit 469 communicates with the controller 60 to acquire information indicating a power running operation time, information such as a detected value of the load current detector 70, and the like from the controller 60. The communication processing unit 469 adds the information indicating the power running operation time to the operation state data of the storage unit 461. The communication processing unit 469 adds a detected value of the load current detector 70 to the electric current value data of the storage unit 461.

Figure 3:
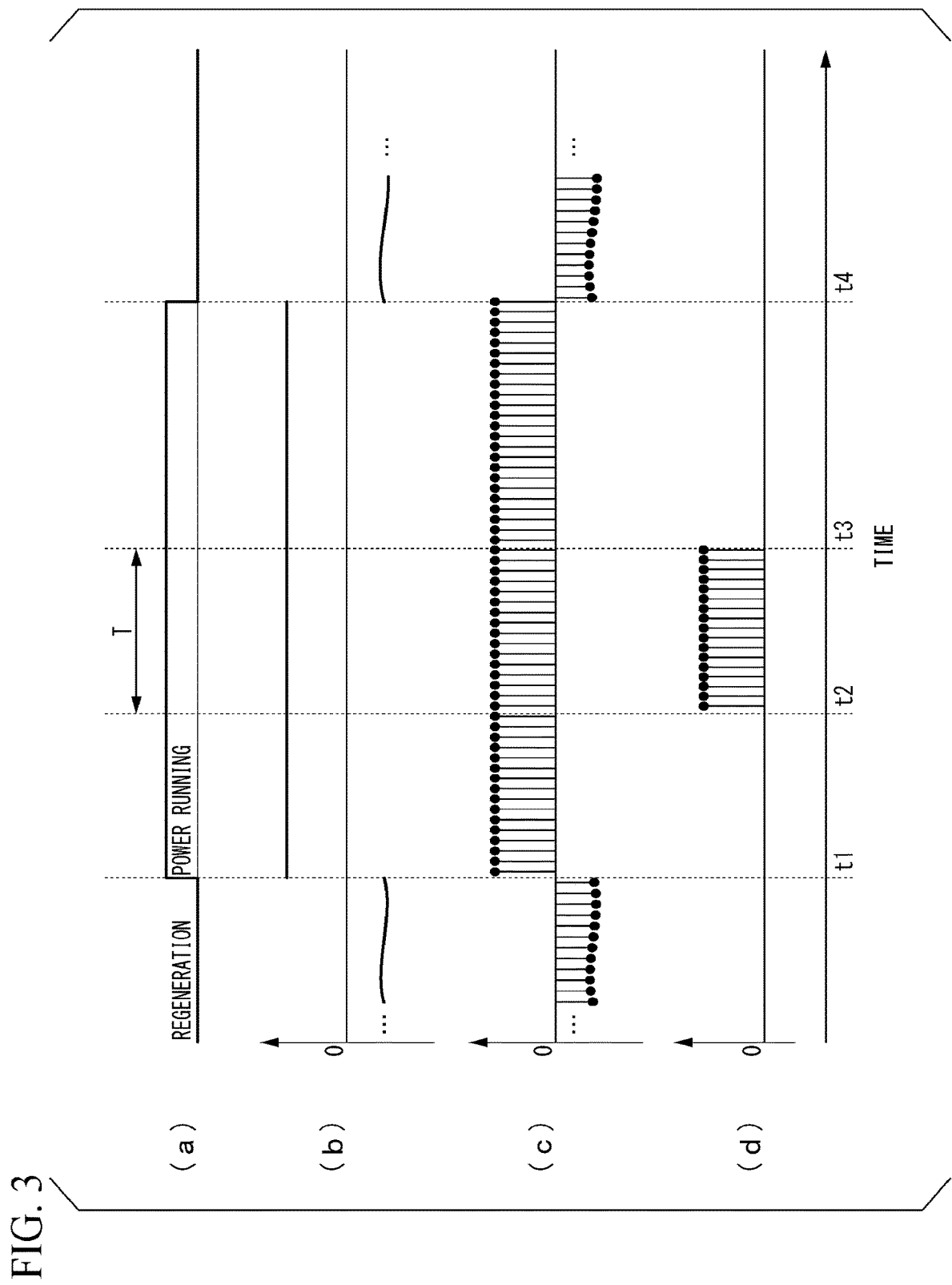
FIG. 3 is a timing chart of signals related to a fast Fourier transform (FFT) process according to the first embodiment.

Next, target data of the FFT process will be described with reference to FIG. 3. FIG. 3 is a timing chart of signals related to the FFT process according to the first embodiment.

The timing chart shown in FIG. 3 shows (a) an operation state of the inverter 50, (b) an electric current value detected by the electric current sensor unit 420, (c) an electric current (standardized data) acquired by the electric current value acquisition unit 462, and (d) data supplied by the electric current value acquisition unit 462 to the FFT unit 465 from the upper side.

In the initial state shown in FIG. 3, the operation state of the inverter 50 becomes a regenerative operation state as shown in (a) of FIG. 3. At this time, the capacitor 30 is charged with regenerated power. For example, the electric current sensor unit 421 detects an electric current with which the capacitor unit 31 is charged. When an electric current discharged by the capacitor unit 31 is indicated by a positive value, the electric current with which the capacitor unit 31 is charged has a negative value as shown in (b) of FIG. 3. When the inverter 50 is in the regenerative operation state, a magnitude of an electric current with which the capacitor unit 31 is charged changes with an amount of regeneration of the electric motor 3. Although modeled data standardized as the electric current value acquired by the electric current value acquisition unit 462 is shown in (c) of FIG. 3, the data has a negative value as in (b) of FIG. 3B.

When time t1 is reached, the controller 60 causes the operation state of the inverter 50 to transition to the power running operation state and controls the inverter 50 according to PWM control. For example, when the inverter 50 is in the power running operation state, the controller 60 controls the inverter 50 so that the electric motor 3 is driven according to a command value.

Thereby, when the above-described power running operation state is established, a discharged electric current flows through the capacitor 30. For example, the electric current sensor unit 421 detects the discharged electric current from the capacitor unit 31. In (b) of FIG. 3, the discharged electric current of the capacitor unit 31 is indicated by a positive value. Likewise, data of the electric current value acquired by the electric current value acquisition unit 462 shown in (c) of FIG. 3 also has a positive value. Also, an interval for standardizing data is defined to be sufficiently short so that a change in the electric current value due to the PWM control can be detected.

The power running operation state of the inverter 50 continues until time t4 and the operation state of the inverter 50 transitions to the regenerative operation state.

The voltage value acquisition unit 464 selects a period T having a predetermined length that has been predefined from a period from time t1 to time t4 for which the inverter 50 is in the power running operation state on the basis of information of the operation state of the inverter 50. A start point of the selected period T is indicated by time t2 and an ending point thereof is indicated by time t3. The period T is a target period of the FFT process.

As shown in (d) of FIG. 3, the voltage value acquisition unit 464 supplies the FFT unit 465 with data existing from time t2 to time t3, so that the FFT unit 465 can perform the FFT process on a detected electric current value corresponding to the period of the operation state of the inverter 50.

Also, an amount of change in the electric current supplied to the electric motor 3 by the inverter 50 controlled in accordance with the command value is relatively small if a change in the load of the electric motor 3 is small. As a result, the discharged electric current from the capacitor unit 31 is unlikely to be affected by the change in the load of the electric motor 3. Therefore, the voltage value acquisition unit 464 may select data in a range where a desired amount of electric current is detected.

Also, although an example in which one target period of the FFT process is provided between the time t1 and the time t4 has been shown in the above-described timing chart, the present invention is not limited thereto and a plurality of target periods of the FFT process may be provided. In this case, the determination unit 467 may use the result of the FFT process in each period for the determination or may perform a statistical process such as an averaging process before the determination to suppress accidental components.

Figure 4:
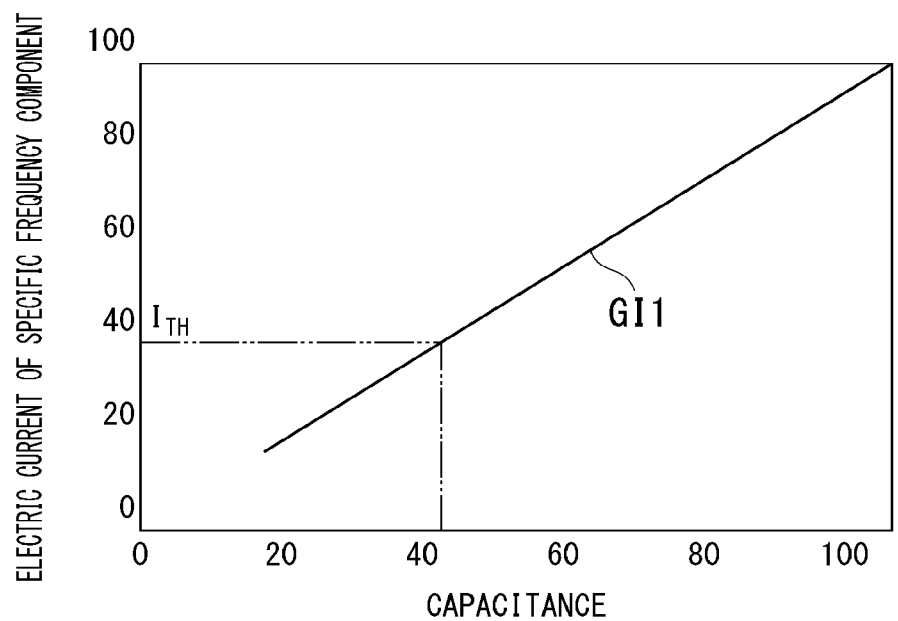
FIG. 4 is a diagram for describing a determination criterion for each capacitor unit according to the first embodiment.

Next, a first determination criterion of the capacitor unit will be described with reference to FIG. 4. FIG. 4 is a diagram for describing the first determination criterion of each capacitor unit according to the first embodiment. A graph shown in FIG. 4 shows a relationship of the electric current of a specific frequency component flowing through each capacitor unit of the capacitor 30 (a vertical axis) with respect to the capacitance of the capacitor unit (a horizontal axis).

In the graph shown in FIG. 4, a straight line GI1 is drawn in a right upward direction when the capacitance of each capacitor unit is in a range from about 10% to 100%. This straight line GI1 indicates the magnitude of the electric current component flowing through each capacitor unit that can be detected when the capacitance of the capacitor is less than 100%. Using the straight line GI1 shown in this graph, the determination criterion for each capacitor unit is defined as follows.

The magnitude (maximum value) of the specific frequency component is defined on the basis of the detected electric current value in an initial state in which the deterioration of each capacitor unit has not progressed. For example, the magnitude is indicated by 100%. A reference value of the first determination criterion for determining the state of each capacitor unit is defined on the basis of a value when the capacitance of each capacitor unit is rated capacitance. Also, the time when the capacitance of each capacitor unit is the rated capacitance is the time when the capacitor unit is in an initial state in which deterioration has not progressed. If the actual capacitance of each capacitor unit can be regarded as the rated capacitance, the capacitance of each capacitor unit does not necessarily have to be 100%.

The value of the first determination criterion is determined to be smaller than the reference value (100%) of the first determination criterion in association with the deterioration state of the capacitor unit. For example, as the deterioration of each capacitor unit progresses, the capacitance of each capacitor unit significantly decreases. Accordingly, the magnitude of the detected electric current value detected by the electric current detector 42 decreases.

The following causes are included as causes in which such an event occurs. For example, assuming that the deterioration of the capacitor unit 31 has progressed and the capacitance thereof has become smaller than an expected value, the capacitor unit 31 is referred to as a deteriorated capacitor unit. On the other hand, assuming that the capacitor unit 32 maintains a normal state and the capacitance thereof is greater than or equal to the expected value, the capacitor unit 32 is referred to as a normal capacitor unit. Even if the deteriorated capacitor unit and the normal capacitor unit are connected in parallel, the terminal voltages of the capacitor units connected in parallel becomes equal, so that the amount of power that can be stored in the deteriorated capacitor unit becomes less than the amount of power that can be stored in the normal capacitor unit.

Assuming that the deteriorated capacitor unit and the normal capacitor unit are discharged in parallel in a state in which they are connected in parallel and the voltage of the DC link decreases from the voltage V1 before discharge to the voltage V2, an amount of charge lost by the deteriorated capacitor unit is less than an amount of charge lost by the normal capacitor unit. Thus, the electric current flowing from the deteriorated capacitor unit becomes less than the electric current flowing from the normal capacitor unit. The first determination criterion of the embodiment is defined on the basis of this tendency.

The first determination criterion used by the determination unit 467 is defined on the basis of the relationship between the magnitude of the electric current component of the above-described specific frequency band and the deterioration state of the capacitor unit and is stored in a determination criterion data table of the storage unit 461. For example, a case in which the determination unit 467 determines the magnitude of the extracted electric current component of the specific frequency band on the basis of a first determination criterion (determination criterion information) stored in a determination criterion data table and diagnoses the state of the capacitor unit 31 on the basis of a determination result will be described.

For example, assuming that the capacitance of the capacitor unit 31 in an initial state in which there is no deterioration is 100%, an electric current component of a frequency band that is twice the carrier frequency f (referred to as a frequency 2f band) flows through the capacitor unit 31 and a magnitude of the electric current component is set to 100%. Furthermore, an allowable lower limit value of the capacitance when the capacitance is reduced due to deterioration is defined as a threshold current $I_{TH}$. Here, a specific value of a threshold current $I_{TH}$ is defined as 40%. Assuming that the deterioration of the capacitor unit 31 progresses and the electric current component of the frequency 2f band is 50%, it may be diagnosed that there is no need to immediately replace the capacitor unit 31 because, although the deterioration is progressing, the electric current component of the frequency 2f band is greater than or equal to 40% of the allowable lower limit value. In the example shown in FIG. 4, because the capacitance of the capacitor unit 31 is about 50% when the electric current component in the frequency 2f band is 50%, the above-described diagnosis is appropriate.

Furthermore, assuming that the deterioration of the capacitor unit 31 progresses and the electric current component in the frequency 2f band is 30%, the deterioration progresses to a state in which the electric current component in the frequency 2f band is not greater than or equal to the allowable limit value of 40% and therefore it may be diagnosed that the capacitor unit 31 needs to be replaced immediately. In the example shown in FIG. 4, when the electric current component in the frequency 2l band is 30%, the capacitance of the capacitor unit 31 is about 30% and therefore the above-described diagnosis is appropriate.

Accordingly, the determination unit 467 can determine a situation of the capacitor unit 31 by employing the threshold current $I_{TH}$ as the first determination criterion defined on the basis of the relationship between the magnitude of the electric current component in the specific frequency band and the deterioration situation of the capacitor unit 31.

Next, a method of determining a frequency band of an analysis target in the first diagnosis process on the capacitor 30 will be described. In the present embodiment, attention is paid to the fact that the amount of power supplied from the inverter 50 in the power running operation state to the electric motor 3 changes in synchronization with the carrier frequency f of the PWM control. For example, when PWM control of a full-bridge type single-phase inverter is performed at a desired modulation rate, a subband component based on a modulated signal of the PWM control is generated in a predetermined frequency range in which a frequency that is twice the carrier frequency f used for PWM control (referred to as frequency 2f) is a center frequency. Thus, the predetermined frequency range in which the frequency 2f is the center frequency may be determined to be the frequency band of the analysis target so that the above-described subband component is included in the frequency band of the analysis target. Signal components included in this frequency range are simply referred to as frequency 2f components. The frequency 2f component corresponds to a frequency component that is twice the carrier frequency f.

The capacitor diagnosis device 40 can diagnose the state of the capacitor 30 applied to the inverter 50 of the full-bridge type single-phase inverter.

Figure 5:
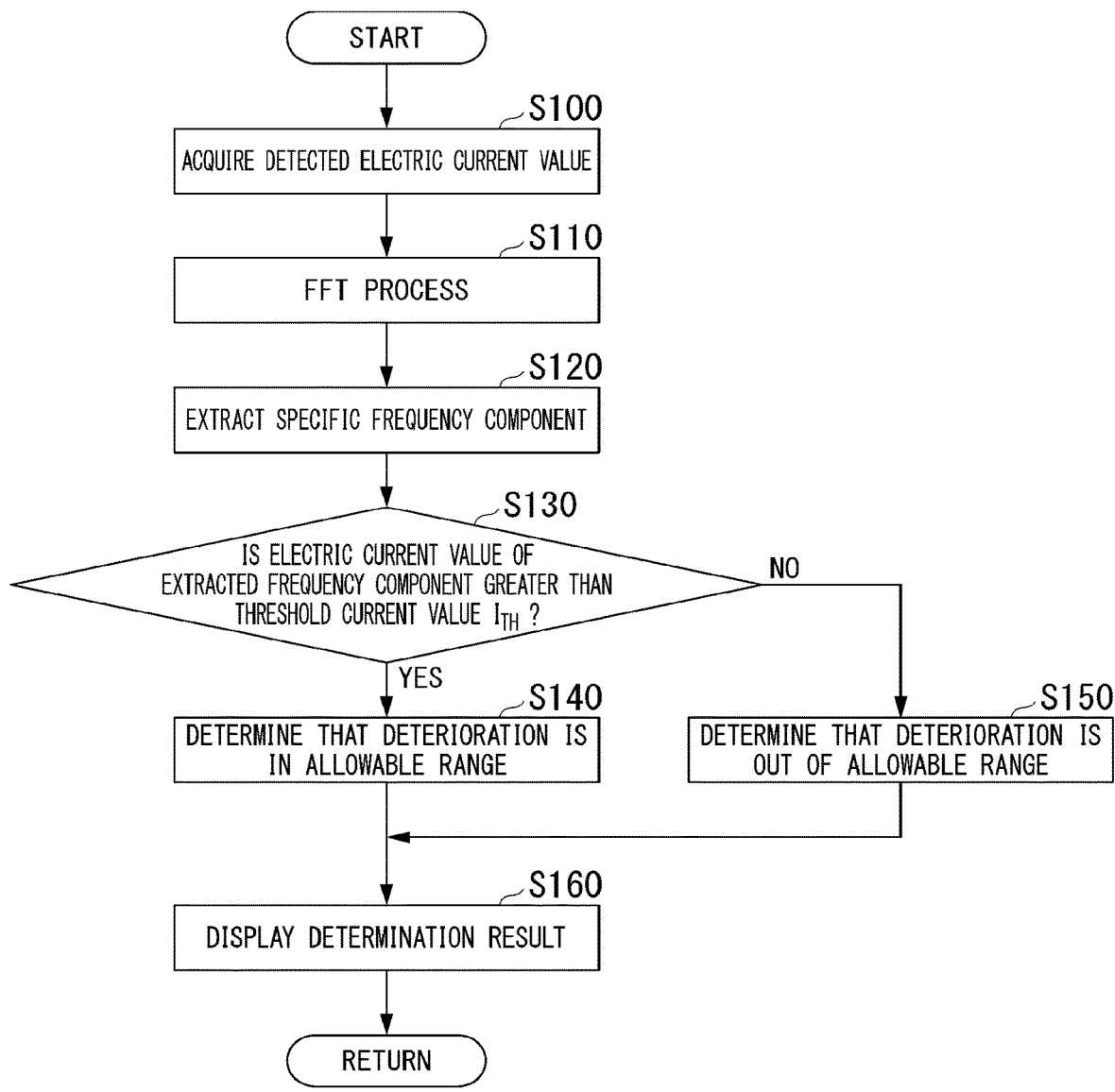
FIG. 5 is a flowchart of a process of diagnosing a state of each capacitor unit according to the first embodiment.

Next, a procedure of diagnosing the state of the capacitor unit will be described with reference to FIG. 5. FIG. 5 is a flowchart of a process of diagnosing the state of each capacitor unit according to the first embodiment.

Although not shown in the above-described flowchart, a voltage acquisition process in which the voltage detector 44 detects a detected value indicating a voltage of the DC link and the acquisition unit 404 acquires the detected value and causes the storage unit 461 to store the detected value is assumed to be performed in parallel with the process shown in FIG. 5.

The power conversion system 2 executes a process of diagnosing the state of the capacitor unit (referred to as a diagnosis process) all the time during a system operation or when a specific event has occurred. The term "all the time during the system operation" means that the diagnosis process is continuously performed and includes, for example, a case in which target periods of first and second FFT processes to be sequentially performed are continuous, a case in which the target periods of the first and second FFT processes to be sequentially performed overlap, a case in which the target periods are continuous except for the time required for switching between the first and second FFT processes to be sequentially performed, and the like. When a specific event has occurred, a timing of each predetermined time interval, the time when a specific condition is satisfied, and the like are included. A case in which the specific condition is satisfied may be, for example, the time when a diagnosis request has been received from the controller 60. At this time, the controller 60 may provide a notification of the above-described diagnosis request when the inverter 50 is in the power running operation state.

The diagnosis process will be described below. First, the acquisition unit 404 acquires data of a predetermined number of detected electric current values when the inverter 50 is in the power running operation state from among data of the detected electric current values stored in the storage unit 461 and outputs the acquired data to the FFT unit 465 (step S100). Next, the FFT unit 465 performs an FFT process on the data of the predetermined number of detected electric current values received from the acquisition unit 404, generates a frequency spectrum FSi, and causes the storage unit 461 to store the generated frequency spectrum FSi (step S110). Next, the extraction unit 466 extracts a specific frequency component, for example, a component of the frequency 2f, from the frequency spectrum FSi stored in the storage unit 461 and causes the storage unit 461 to store the extracted component as an extracted frequency component $F_{ext1}$ (step S120).

Next, the determination unit 467 determines whether or not an electric current $I_{Fext}$ of the extracted frequency component $F_{ext1}$ stored in the storage unit 461 is greater than a predetermined threshold current $I_{TH}$ (step S130). When the electric current $I_{Fext}$ is greater than the threshold current $I_{TH}$, the determination unit 467 determines that the deterioration of the capacitor unit is in an allowable range and stores a determination result in the storage unit 461 in association with the electric current $I_{Fext}$ of the extracted frequency component $F_{ext1}$ (step S140).

When the electric current $I_{Fext}$ is less than or equal to the threshold current the determination unit 467 determines that the deterioration of the capacitor unit is out of the allowable range and stores a determination result in the storage unit 461 in association with the electric current $I_{Fext}$ of the extracted frequency component $F_{ext1}$ (step S150).

Next, when the processing of step S140 or step S150 is completed, the display processing unit 468 causes the display 45 to display the determination result for each capacitor unit (step S160) and causes a series of steps of processing to be ended.

Through the above process, the capacitor diagnosis device 40 can determine the state of each capacitor unit.

According to the first embodiment, the capacitor diagnosis device 40 diagnoses the inverter 50 for converting DC power smoothed by the capacitor unit 31 (a first capacitor unit) and the capacitor unit 32 (a second capacitor unit) connected in parallel to each other with respect to the DC link into AC power according to the power running operation. The capacitor diagnosis device 40 includes an electric current sensor unit 421, an FFT unit 465 (a first frequency spectrum analysis unit), an extraction unit 466, and a determination unit 467. The electric current sensor unit 421 detects an electric current flowing through the capacitor unit 31. The FFT unit 465 generates a frequency spectrum FSi (a first frequency spectrum) based on a detection result of the electric current sensor unit 421 detected during the power running operation of the inverter 50. The extraction unit 466 extracts an electric current component of a specific frequency band related to a frequency depending on the configuration of the inverter 50 on the basis of the frequency spectrum FSi. The determination unit 467 can easily detect the deterioration of the capacitor unit 31 by diagnosing the state of the capacitor unit 31 on the basis of at least a magnitude of the extracted electric current component of the specific frequency band. Also, the capacitor units 31, 32, and 33 are examples of capacitors. The electric current sensor unit 420 is an example of a sensor. An electric current value detected by the electric current sensor unit 420 is an example of a physical quantity.

The same applies to the capacitor unit 32 and the capacitor unit 33. For example, in the case of the capacitor unit 32, the electric current sensor unit 422 detects an electric current flowing through the capacitor unit 32. The FFT unit 465 generates a frequency spectrum FSi2 (a second frequency spectrum) based on the detection result of the electric current sensor unit 422 detected during the power running operation of the inverter 50. The extraction unit 466 extracts the electric current component of the specific frequency band based on the frequency spectrum FSi2 as described above. The determination unit 467 may diagnose the state of the capacitor unit 32 on the basis of at least a magnitude of the extracted current component of the specific frequency band.

According to the first embodiment, the power conversion system 2 includes at least the capacitor 30, the capacitor diagnosis device 40, the inverter 50, and the controller 60. The inverter 50 includes a switching device 50S and converts DC power smoothed by the capacitor 30 including the capacitor units 31, 32, 33 and the like into AC power according to a power running operation for causing the switching device 50S to be switched. At this time, the capacitor diagnosis device 40 uses the first frequency spectrum generated on the basis of the detection result of the electric current sensor unit 421 detected during the power running operation of the inverter 50 for diagnosis of deterioration of the capacitor units 31, 32, 33 and the like. Thereby, the power conversion system 2 can easily detect the deterioration of the capacitor units 31, 32, 33, and the like.

According to the first embodiment, the switching device 50S of the inverter 50 is controlled by PWM control using a carrier signal having a fixed carrier frequency. The extraction unit 466 may extract an electric current component of a defined frequency band based on an integer multiple of the carrier frequency as an electric current component of a specific frequency band on the basis of the generated first frequency spectrum. Accordingly, the electric current component of the frequency band defined on the basis of the carrier frequency can be extracted as the electric current component of the specific frequency band. For example, a magnification with respect to the carrier frequency that defines the frequency band is defined on the basis of the configuration (specifications) of the inverter 50. It is only necessary to increase the above-described magnification by a factor of 2 if the inverter 50 is a single-phase full-bridge inverter and increase the above-described magnification by a factor of 6 if the inverter 50 is a three-phase full-bridge inverter. When the inverter 50 is a full-bridge inverter as described above, the above-described magnification is an even number regardless of the number of phases of the inverter 50.

Second Embodiment

A power conversion system 2A according to a second embodiment will be described.

The power conversion system 2 according to the first embodiment diagnoses a state of each capacitor unit on the basis of a magnitude of a specific frequency component of an electric current flowing through each capacitor unit. Instead, the power conversion system 2A diagnoses a state of a capacitor 30 including a plurality of capacitor units. This will be described below.

Figure 6:
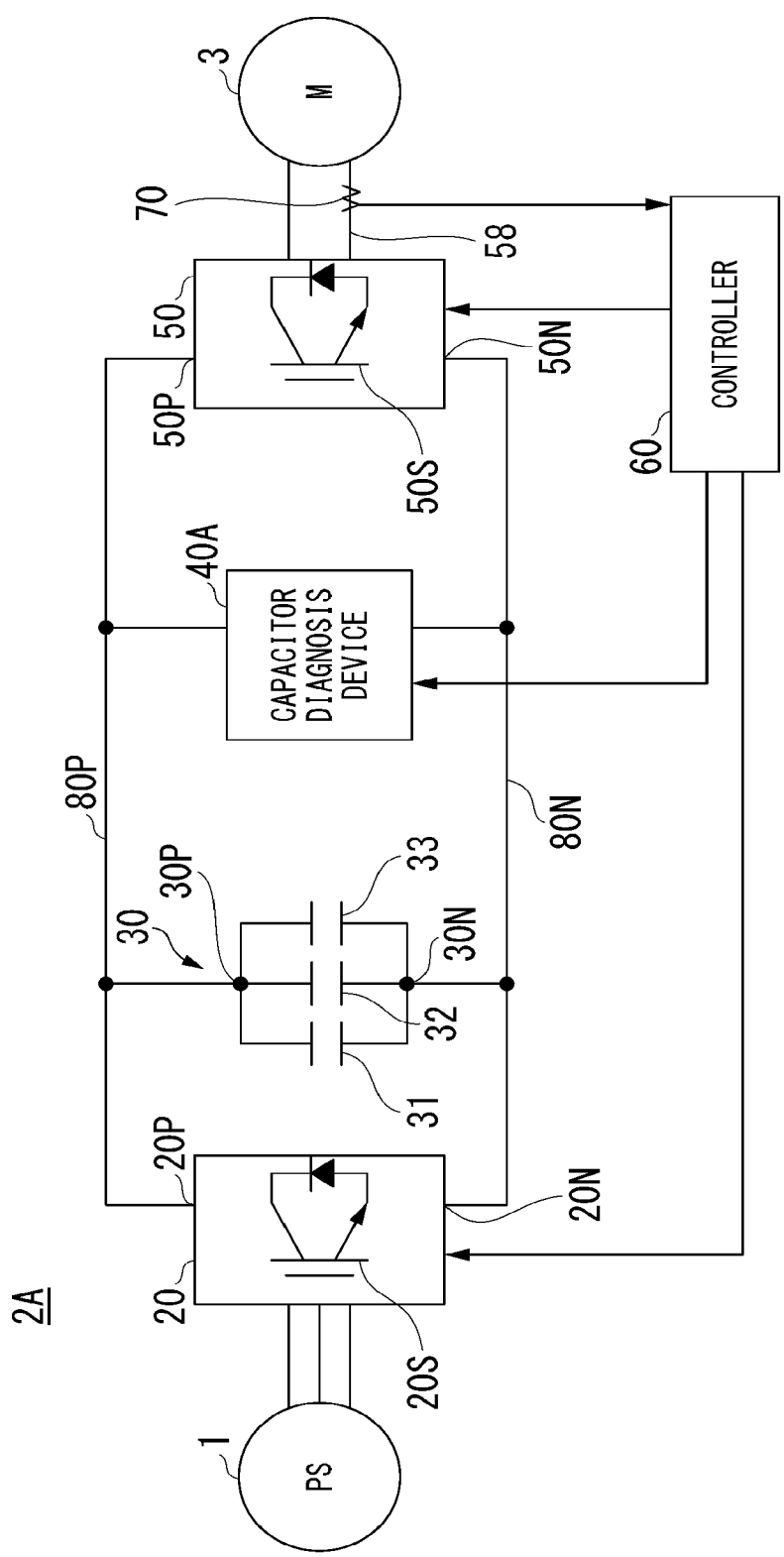
FIG. 6 is a configuration diagram of a power conversion system according to a second embodiment.

FIG. 6 is a configuration diagram of the power conversion system 2A according to the second embodiment.

The power conversion system 2A shown in FIG. 6 includes a capacitor diagnosis device 40A instead of the capacitor diagnosis device 40 in the above-described power conversion system 2.

Figure 7:
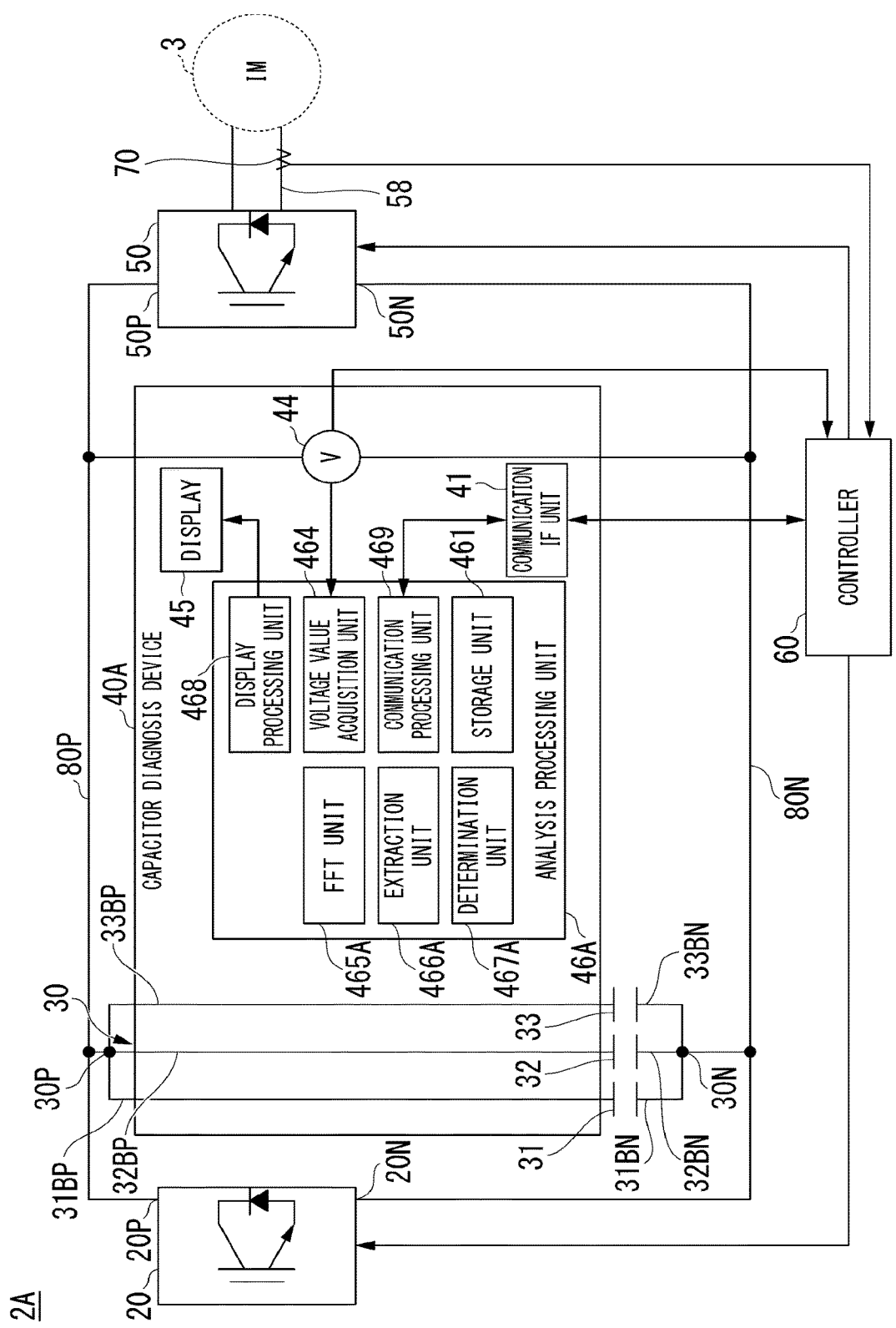
FIG. 7 is a configuration diagram of a capacitor diagnosis device according to the second embodiment.

FIG. 7 is a configuration diagram of the capacitor diagnosis device 40A of the second embodiment.

The capacitor diagnosis device 40A shown in FIG. 7 does not include the electric current detector 42 of the capacitor diagnosis device 40 and includes an analysis processing unit 46A instead of the analysis processing unit 46.

The analysis processing unit 46A does not include the electric current value acquisition unit 462 and includes an FFT unit 465A, an extraction unit 466A, and a determination unit 467A instead of the FFT unit 465, the extraction unit 466, and the determination unit 467 of the analysis processing unit 46. The analysis processing unit 46A performs an FFT process on a predetermined number of detected voltage values received from the voltage value acquisition unit 464 instead of performing an FFT process on the predetermined number of detected electric current values received from the electric current value acquisition unit 462. This will be described below.

The FFT unit 465A (a third frequency spectrum analysis unit) generates a frequency spectrum FSv by performing an FFT process on a predetermined number of detected voltage values received from the voltage value acquisition unit 464 and causes the storage unit 461 to store the generated frequency spectrum FSv. In addition, the detected electric current value in the description of the FFT unit 465 described above is replaced with a detected voltage value.

The extraction unit 466A extracts a voltage component of a specific frequency band related to a frequency depending on the configuration of the inverter 50 from the frequency spectrum FSv generated by the FFT unit 465 and stored in the storage unit 461 and adds the extracted component to the extracted frequency component data of the storage unit 461 as an extracted frequency component $F_{ext2}$.

The determination unit 467A determines a magnitude of the extracted frequency component $F_{ext2}$ extracted by the extraction unit 466 and stored in the storage unit 461 on the basis of a second determination criterion defined in advance.

Figure 8:
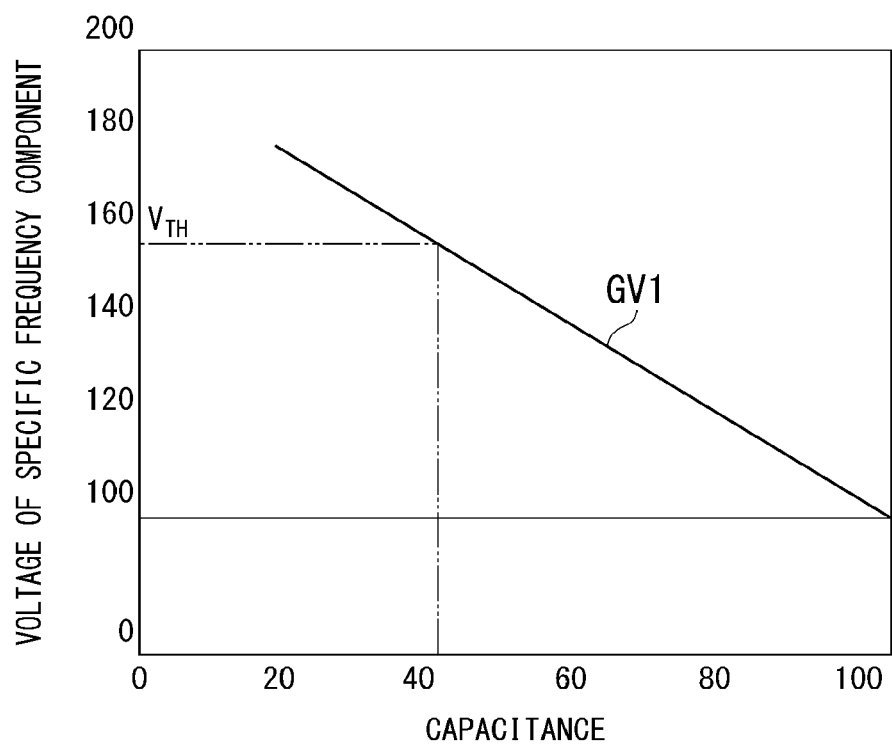
FIG. 8 is a diagram for describing a second determination criterion for a capacitor according to the second embodiment.

Next, the second determination criterion for the capacitor 30 will be described with reference to FIG. 8. FIG. 8 is a diagram for describing the second determination criterion of the capacitor 30 according to the second embodiment. The graph shown in FIG. 8 shows a relationship of the voltage of a specific frequency component of a DC link (a vertical axis) with respect to the capacitance of the capacitor 30 (a horizontal axis).

In the graph shown in FIG. 8, a straight line GV1 is drawn in a right downward direction when the capacitance of the capacitor 30 is in a range from about 10% to 100%. This straight line GV1 indicates a magnitude of a DC link voltage component (a ripple voltage component) that can be detected when the capacitance of the capacitor 30 is less than 100%. Using GV1 shown in this graph, the second determination criterion of the capacitor 30 is defined as follows.

The magnitude (minimum value) of the specific frequency component is defined on the basis of the detected voltage value in an initial state in which the deterioration of the capacitor 30 has not progressed. For example, the magnitude is indicated by 100%.

The value of the above-described determination criterion is determined to be a value greater than the reference value (100%) of the above-described determination criterion in association with the deterioration state of the capacitor 30. For example, as the deterioration of the capacitor 30 progresses, the capacitance of the capacitor 30 decreases. Accordingly, the detected voltage value detected by the voltage detector 44 increases. The second determination criterion may be defined so that the increase or decrease can be identified.

The following cases are included as causes in which such an event occurs. For example, when a deteriorated capacitor unit occurs among capacitor units of the capacitor 30 connected in parallel, a sum of capacitances of the capacitor units connected in parallel is reduced and a component that cannot be smoothed is generated as a ripple voltage.

The second determination criterion used by the determination unit 467A is defined on the basis of a relationship between the magnitude of the voltage component in the above-described specific frequency band and the deterioration situation of the capacitor 30 and is stored in a determination criterion data table of the storage unit 461. The determination unit 467A determines the magnitude of the extracted current component of the specific frequency band on the basis of the second determination criterion stored in the determination criterion data table and diagnoses the state of the capacitor 30 on the basis of a determination result.

For example, when the capacitance of the capacitor 30 in an initial state in which there is no deterioration is 100%, an electric current component of the frequency 2f band flows through the capacitor 30. In this case, a magnitude of the voltage component (a ripple voltage component) of the DC link becomes 100%. Furthermore, an allowable upper limit value of the capacitance when the capacitance is reduced due to deterioration is defined as a threshold voltage $V_{TH}$. Here, a specific value of the threshold voltage $V_{TH}$ is defined as 160%. If the deterioration of the capacitor 30 progresses and the voltage component in the frequency 2f band is 150%, it may be diagnosed that there is no need to immediately replace the capacitor 30 because, although the deterioration is progressing, the electric current component of the frequency 2f band does not exceed 160% of the allowable upper limit value. In the example shown in FIG. 8, when the electric current component in the frequency 2f band is 150%, the capacitance of the capacitor 30 is about 50% and therefore the above-described diagnosis is appropriate.

Furthermore, if the electric current component in the frequency 2f band is 170%, the deterioration progresses to a state in which the electric current component in the frequency 2f band exceeds 160% of the allowable limit value and therefore it may be diagnosed that the capacitor 30 needs to be replaced immediately. In the example shown in FIG. 8, because the capacitance of the capacitor 30 is about 30% when the electric current component in the frequency 2f band is 170%, the above-described diagnosis is appropriate.

Although the second determination criterion is used to determine a sum of capacitances of the capacitor units in the capacitor 30 as described above and the deteriorated capacitor unit cannot be specified only by a determination result of the determination using the second determination criterion, it is possible to specify the capacitor 30 in which the deteriorated capacitor unit is likely to occur by diagnosing the capacitor units connected in parallel together. According to the above-described method, it is possible to more easily identify the capacitor 30 in which the deteriorated capacitor unit is likely to occur than in the method of individually diagnosing the capacitor units.

In particular, when a maintenance method of replacing the capacitor 30 with a new capacitor 30 is used, the diagnosis method according to the present embodiment is effective for reducing the load of the analysis process because the maintenance method matches a unit of a determination according to the present embodiment.

Thereby, the determination unit 467A can use the second determination criterion defined on the basis of a relationship between the magnitude of the electric current component in the specific frequency band and the deterioration situation of the capacitor 30, and can further diagnose the presence/absence of a deteriorated capacitor unit using the above-described second determination criterion.

Figure 9:
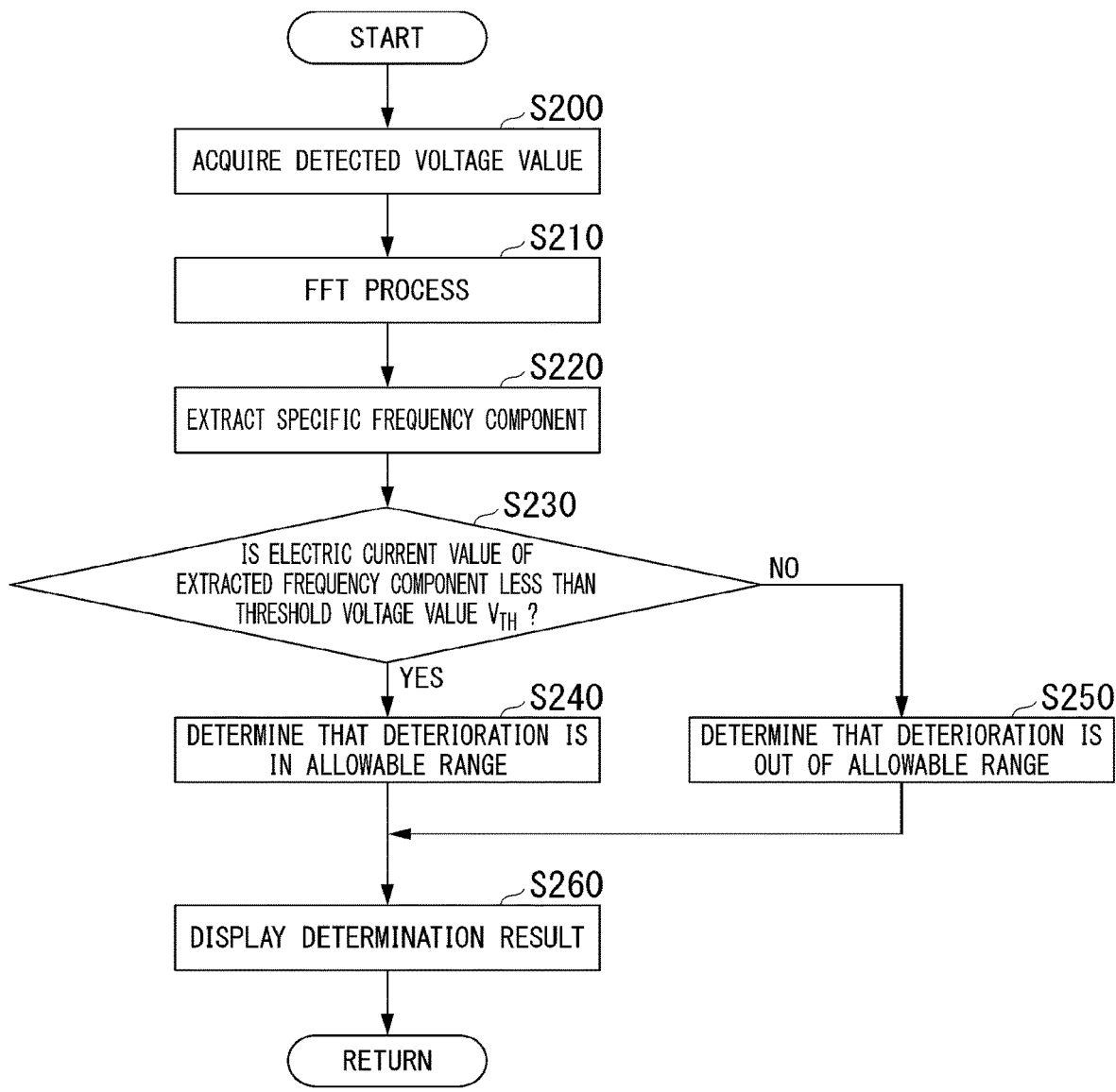
FIG. 9 is a flowchart of a process of diagnosing a state of the capacitor according to the second embodiment.

Next, a procedure of diagnosing the state of the capacitor 30 will be described with reference to FIG. 9. FIG. 9 is a flowchart of a process of diagnosing the state of the capacitor 30 according to the second embodiment.

Also, although not shown in the above-described flowchart, a voltage acquisition process in which the voltage detector 44 detects a detected value indicating a voltage of the DC link and the voltage value acquisition unit 464 acquires the detected value and causes the storage unit 461 to store the detected value is assumed to be performed in parallel with the process shown in FIG. 9.

The power conversion system 2A executes a process of diagnosing the state of the capacitor 30 (referred to as a diagnosis process) all the tune during a system operation or when a specific event has occurred. The term "all the time during the system operation" means that the diagnosis process is continuously performed and includes, for example, a case in which target periods of first and second FFT processes to be sequentially performed are continuous, a case in which the target periods of the first and second FFT processes to be sequentially performed overlap, a case in which the target periods are continuous except for the time required for switching between the first and second FFT processes to be sequentially performed, and the like. When a specific event has occurred, a dining of each predetermined time interval, the time when a specific condition is satisfied, and the like are included. A case in which the specific condition is satisfied may be, for example, the time when a diagnosis request has been received from the controller 60. At this time, the controller 60 may provide a notification of the above-described diagnosis request when the inverter 50 is in the power running operation state.

The diagnosis process will be described below. First, the voltage value acquisition unit 464 acquires data of a predetermined number of detected voltage values when the inverter 50 is in the power running operation state from among data of the detected voltage values stored in the storage unit 461 and outputs the data to the FFT unit 465A (step S200). Next, the FFT unit 465A performs an FFT process on the data of the predetermined number of detected voltage values received from the voltage value acquisition unit 464, generates a frequency spectrum FSv, and causes the storage unit 461 to store the generated frequency spectrum FSv (step S210). Next, the extraction unit 466A extracts, for example, a component of the frequency 2f, from the frequency spectrum FSv stored in the storage unit 461 and causes the storage unit 461 to store the extracted component as an extracted frequency component $F_{ext2}$ (step S220).

Next, the determination unit 467A determines whether or not a voltage $V_{Fext}$ of the extracted frequency component $F_{ext2}$ stored in the storage unit 461 is less than a predetermined threshold voltage $V_{TH}$ (step S230). When the voltage $V_{Fext}$ is less than the threshold voltage $V_{TH}$, the determination unit 467A determines that the deterioration of the capacitor 30 is in an allowable range, and stores the determination result in the storage unit 461 in association with the voltage $V_{Fext}$ of the extracted frequency component $F_{ext2}$ (step S240).

When the voltage $V_{Fext}$ is greater than or equal to the threshold voltage $V_{TH}$, the determination unit 467A determines that the deterioration of the capacitor 30 is out of the allowable range and stores a determination result in the storage unit 461 in association with the voltage $V_{Fext}$ of the extracted frequency component $F_{ext2}$ (step S250).

Next, when the processing of step S240 or step S250 is completed, the display processing unit 468 causes the display 45 to display the determination result of the capacitor 30 (step S260) and causes a series of steps of processing to be ended.

Through the above process, the capacitor diagnosis device 40A can determine the state of the capacitor 30.

According to the second embodiment, the capacitor diagnosis device 40A diagnoses the inverter 50 for converting DC power smoothed by the capacitor unit 31 and the capacitor unit 32 connected in parallel with respect to the DC link into AC power according to the power running operation. The capacitor diagnosis device 40A includes the voltage detector 44, the FFT unit 465A, the extraction unit 466A, and the determination unit 467A. The voltage detector 44 detects the voltage of the DC link. The FFT unit 465A generates a frequency spectrum FSv (a third frequency spectrum) based on the detection result of the voltage detector 44 detected during the power running operation of the inverter 50. The extraction unit 466A extracts a voltage component of a specific frequency band related to a frequency depending on the configuration of the inverter 50 on the basis of the frequency spectrum FSv. The determination unit 467A can easily detect the deterioration of the capacitor 30 by diagnosing the state of the capacitor 30 on the basis of at least the magnitude of the extracted current component of the specific frequency band. The voltage detector 44 is an example of a sensor. The voltage value detected by the voltage detector 44 is an example of a physical quantity.

Modified Examples of Second Embodiment

Modified examples of the second embodiment will be described.

Figure 10:
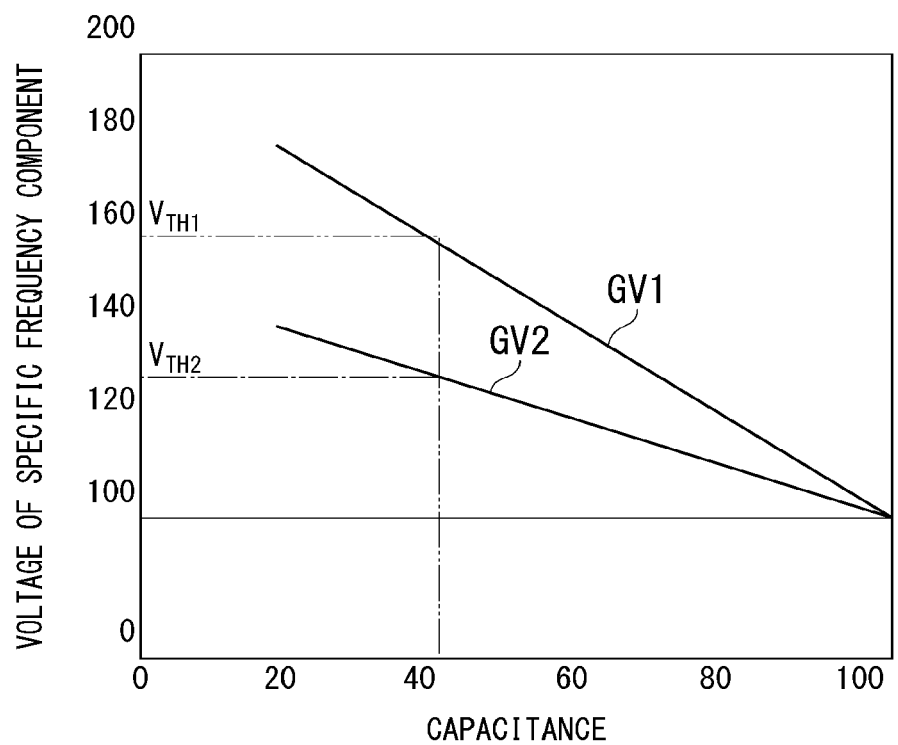
FIG. 10 is a diagram showing a third determination criterion for the capacitor according to a modified example of the second embodiment.

In the second embodiment, a case in which a determination is made using the second determination criterion having one determination criterion shown in FIG. 8 has been described. In the present modified example, a case in which a determination is made using a third determination criterion including a plurality of determination criteria will be described with reference to FIG. 10. FIG. 10 is a diagram for describing the third determination criterion of the capacitor 30 according to the modified example of the second embodiment. In the graph shown in FIG. 10, as in the graph shown in FIG. 8, straight lines GV1 and GV2 are drawn in a right downward direction when the capacitance of each capacitor unit is in a range from about 10% to 100%. The straight line GV2 has a gentler slope than the straight line GV1.

When the power consumption of the electric motor 3 changes, the electric current flowing through the electric motor 3 changes. Accordingly, a magnitude of the ripple voltage of the DC link also changes. Therefore, the third determination criterion in the present modified example is a determination criterion depending on an AC load current associated with a magnitude of a detected value of an alternating current (an AC load current) flowing through the electric motor 3 detected by the load current detector 70. In this case, a threshold voltage $V_{TH}$ may increase as a detected value of the alternating current flowing through the electric motor 3 increases. For example, the straight line GV1 is used when the electric current flowing through the electric motor 3 is relatively large and the straight line GV2 is used when the electric current flowing through the electric motor 3 is relatively small.

For example, the determination unit 467A selects an appropriate characteristic value from selectable characteristic values on the basis of the magnitude of the electric current flowing through the electric motor 3 and determines the appropriate characteristic value as a determination criterion. For example, the third determination criterion uses a threshold voltage $V_{TH1}$ and a threshold voltage $V_{TH2}$ as threshold values. Also, the threshold voltage $V_{TH1}$ is the same as the threshold voltage $V_{TH}$.

By using the threshold voltage $V_{TH1}$ and the threshold voltage $V_{TH2}$ defined as described above, the determination unit 467A can diagnose the state of the capacitor 30 on the basis of at least the magnitude of the extracted component of the specific frequency band and the detected value of the alternating current flowing through the electric motor 3.

Thereby, when the magnitude of the ripple voltage of the DC link changes with a change in the power consumption of the electric motor 3, the state of the capacitor 30 can also be diagnosed without being affected by the change in the power consumption of the electric motor 3.

Third Embodiment

A power conversion system 2B according to a third embodiment will be described.

The power conversion system 2B of the third embodiment specifies the capacitor 30 in a deteriorated state and subsequently diagnoses the state of each capacitor unit in the capacitor 30. This will be described below.

Figure 11:
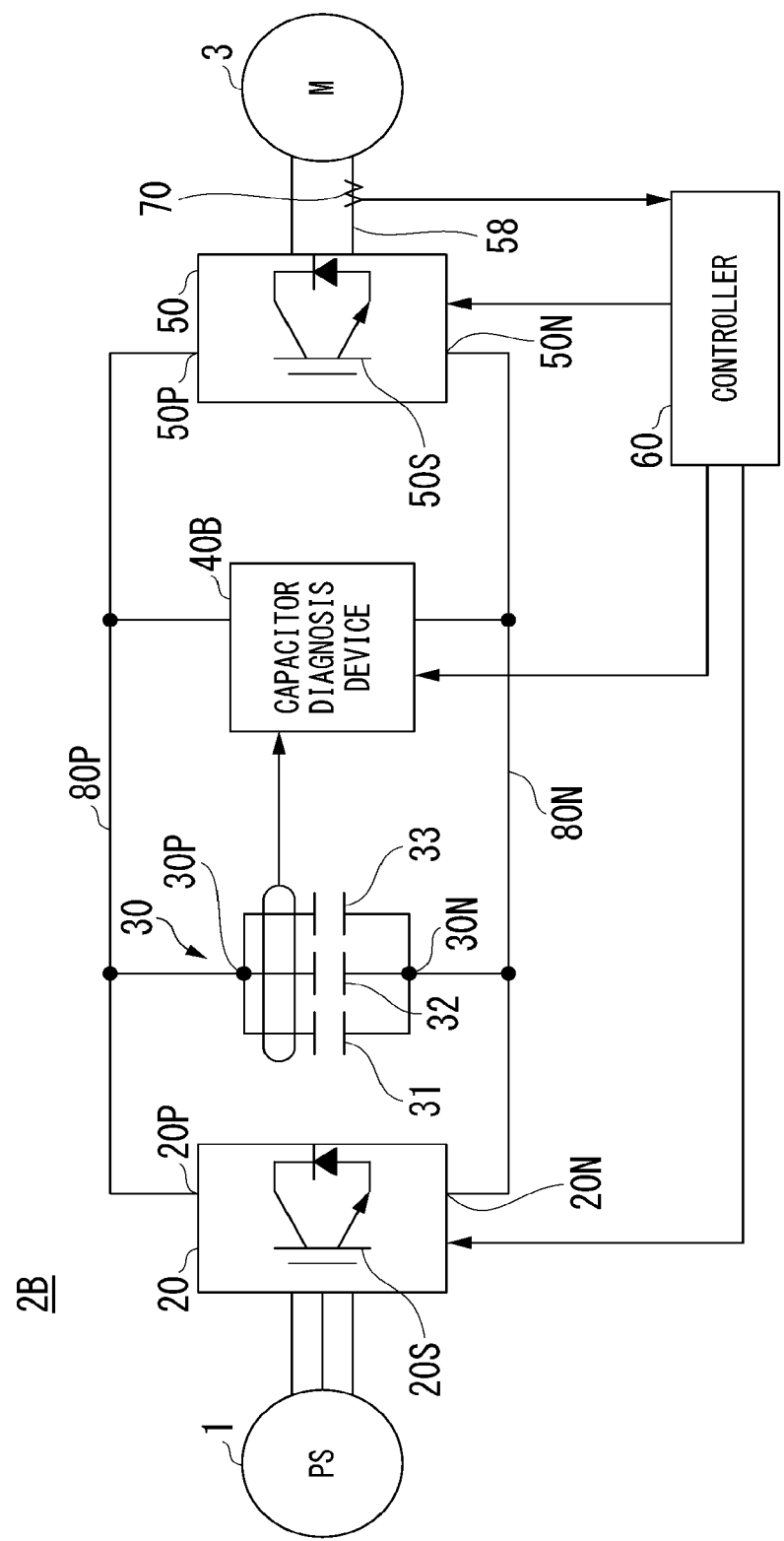
FIG. 11 is a configuration diagram of a power conversion system according to a third embodiment.

FIG. 11 is a configuration diagram of the power conversion system 2B according to the third embodiment.

The power conversion system 2B shown in FIG. 11 includes a capacitor diagnosis device 40B instead of the capacitor diagnosis device 40 in the above-described power conversion system 2.

Figure 12:
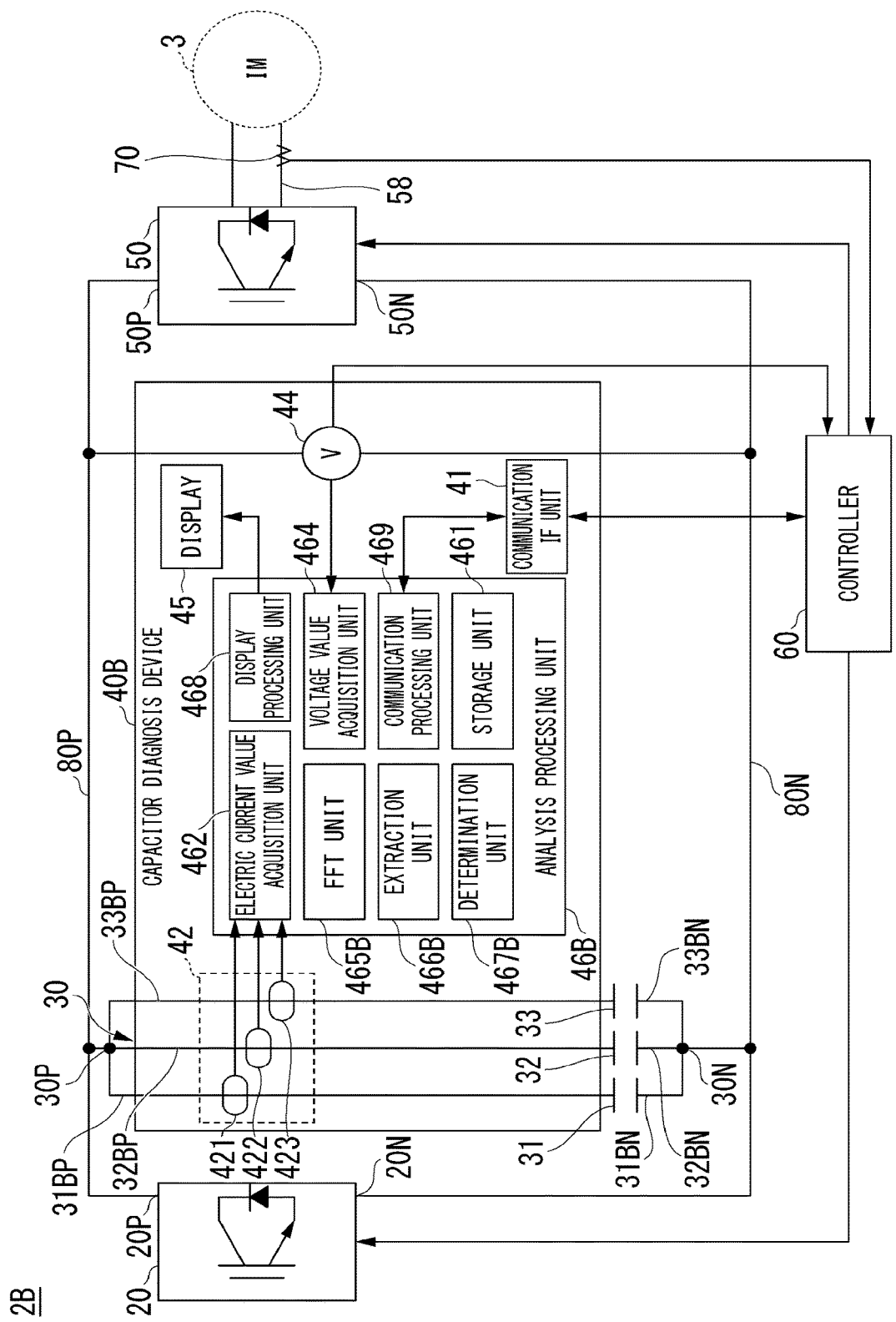
FIG. 12 is a configuration diagram of a capacitor diagnosis device according to the third embodiment.

FIG. 12 is a configuration diagram of the capacitor diagnosis device 40B of the third embodiment.

The capacitor diagnosis device 40B shown in FIG. 12 includes an analysis processing unit 46B instead of the analysis processing unit 46 of the capacitor diagnosis device 40.

The analysis processing unit 46B includes an FFT unit 465B, an extraction unit 466B, and a determination unit 467B instead of the FFT unit 465, the extraction unit 466, and the determination unit 467 of the analysis processing unit 46.

The FFT unit 465B performs the processes of the FFT unit 465 and the FFT unit 465A described above. The notations of the FFT unit 465 and the FFT unit 465A in the description of the FFT unit 465 and the FFT unit 465A described above are replaced with the FFT unit 465B.

The extraction unit 466B performs the processes of the extraction unit 466 and the extraction unit 466A described above. The notations of the extraction unit 466 and the extraction unit 466A in the description of the extraction unit 466 and the extraction unit 466A described above are replaced with the extraction unit 466B.

The determination unit 467B performs the processes of the above-described determination unit 467 and the determination unit 467A. The notations of the determination unit 467 and the determination unit 467A in the description of the determination unit 467 and the determination unit 467A described above are replaced with the determination unit 467B.

The analysis processing unit 46B has the above-described configuration and therefore performs an FFT process on a predetermined number of detected voltage values received from the voltage value acquisition unit 464 and performs an FFT process on a predetermined number of detected electric current values received from the electric current value acquisition unit 462 when a predetermined condition is satisfied.

Figure 13:
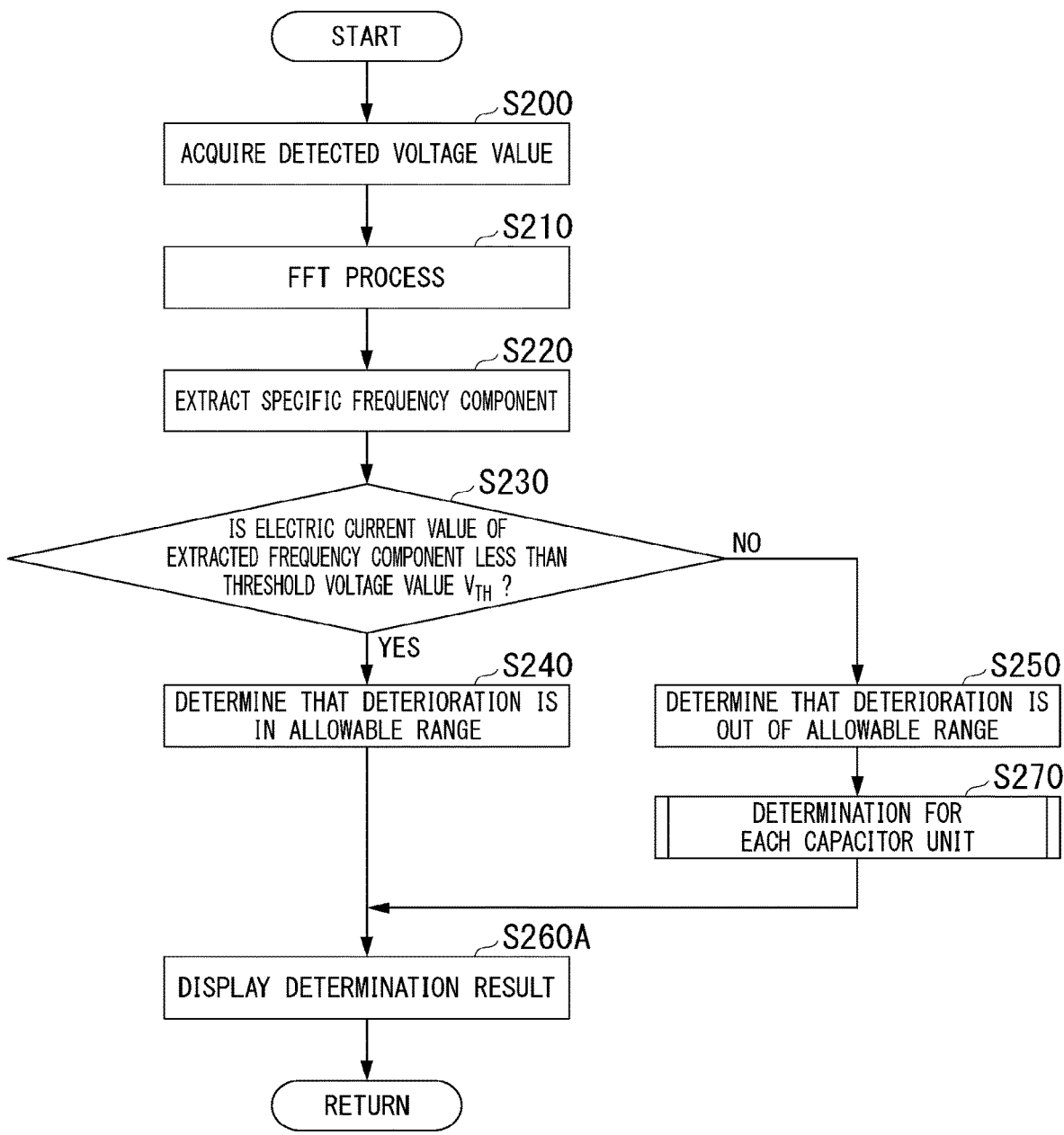
FIG. 13 is a flowchart of a process of diagnosing a state of a capacitor according to the third embodiment.

FIG. 13 is a flowchart of a process of diagnosing the state of the capacitor according to the third embodiment.

In the first embodiment, the power conversion system 2 for diagnosing the state of each capacitor unit on the basis of the magnitude of the specific frequency component of the electric current flowing through each capacitor unit has already been described. Also, in the second embodiment, the power conversion system 2A for diagnosing the state of the capacitor 30 including the plurality of capacitor units has been described. In the present embodiment, differences between the first embodiment and the second embodiment will be mainly described.

First, the analysis processing unit 46B of the capacitor diagnosis device 40B performs the processing of steps S200 to S220.

Next, the determination unit 467B determines whether or not a voltage $V_{Fext}$ of an extracted frequency component $F_{ext2}$ stored in the storage unit 461 is less than a predetermined threshold voltage $V_{TH}$ (step S230). When the voltage $V_{Fext}$ is less than the threshold voltage $V_{TH}$, the determination unit 467B determines that the deterioration of the capacitor 30 is in an allowable range and stores a determination result in the storage unit 461 in association with the voltage $V_{Fext}$ of the extracted frequency component $F_{ext2}$ (step S240). On the other hand, when the voltage $V_{Fext}$ is greater than or equal to the threshold voltage $V_{TH}$, the determination unit 467B determines that the deterioration of the capacitor 30 is out of the allowable range and stores a determination result in the storage unit 461 in association with the voltage $V_{Fext}$ of the extracted frequency component $F_{ext2}$ (step S250).

Next, the analysis processing unit 46B performs a determination process on each capacitor unit within the capacitor 30 (step S270). In the determination process on each capacitor unit, the above-described processing of steps S100 to S150 of FIG. 5 for each capacitor unit within the capacitor 30 is performed. A deteriorated capacitor unit and a normal capacitor unit within the capacitor 30 are identified by the determination process.

Next, when the processing of step S240 or step S270 is completed, the display processing unit 468 causes the display 45 to display the determination result of each capacitor 30 and the determination result of each capacitor unit (step S260A) and causes a series of steps of processing to be ended.

According to the above-described embodiment, the analysis processing unit 46B generates the frequency spectrum FSv (a third frequency spectrum) based on the detection result of the voltage detector 44 detected during the power running operation of the inverter 50 and determines the state of deterioration of the capacitor 30. Furthermore, when the deterioration of the capacitor 30 has been detected in a determination result based on the frequency spectrum FSv, the frequency spectrum FSi based on the detection result of the electric current detector 42 detected during the power running operation of the inverter 50 (a first frequency spectrum and a second frequency spectrum) is generated and the state of each capacitor unit is determined. Thereby, the determination of the level of the capacitor 30 and the determination of the level of each capacitor unit can be performed separately, so that the processing related to the determination can be simplified.

According to at least one embodiment described above, a capacitor diagnosis device includes a sensor, a frequency spectrum analysis unit, a frequency component extraction unit, and a diagnosis processing unit. The sensor detects an electric current flowing through a capacitor in a power conversion unit for converting DC power smoothed by a capacitor connected in parallel to a DC link into AC power according to a power running operation. The frequency spectrum analysis unit generates a frequency spectrum based on a detection result of the sensor detected during the power running operation of the power conversion unit. The frequency component extraction unit extracts a component of a specific frequency band related to a frequency depending on a configuration of the power conversion unit on the basis of the first frequency spectrum. The diagnosis processing unit diagnoses a state of the capacitor on the basis of at least a magnitude of the extracted component of the specific frequency band. Thereby, the capacitor diagnosis device can easily detect the deterioration of a capacitor.

While some embodiments of the invention have been described, these embodiments are merely examples, and are not intended to limit the scope of the invention. These novel embodiments may be implemented in various other forms, and various omissions, replacements, and modifications may be made without departing from the scope of the invention. These embodiments and the modifications are included in the scope or the spirit of the invention, and are included in the scope of the invention of claims and the equivalents thereof.

In the embodiment described above, the fundamental frequency of the AC output of the inverter 50 may be fixed to a predetermined value and the fundamental frequency of the AC output of the inverter 50 may be changed in real time to accelerate or decelerate the electric motor 3. In this case, it is only necessary for the capacitor diagnosis device 40 to perform a predetermined diagnosis process when the fundamental frequency of the AC output of the inverter 50 does not interfere with the frequency band detected by the capacitor diagnosis device 40.

REFERENCE SIGNS LIST

1 AC power supply
2, 2A, 2R Power conversion system
3 Electric motor
20 Rectifier
30 Capacitor
31, 32, 33 Capacitor unit
40, 40A, 40B Capacitor diagnosis device
50 Inverter
60 Controller
70 Load current detector
42 Electric current detector
420, 423 Electric current sensor unit
421 Electric current sensor unit (first electric current sensor)
422 Electric current sensor unit (second electric current sensor)
44 Voltage detector 46, 46A, 46B Analysis processing unit
465, 465A, 465B FFT unit
466, 466A, 466B Extraction unit
467, 467A, 467B Determination unit

The invention claimed is:

1. A capacitor diagnosis device comprising:
a sensor configured to detect a physical quantity that changes with an electric current flowing through a capacitor in a power conversion unit for converting direct current (DC) power smoothed by the capacitor connected in parallel to a DC link into alternating current (AC) power according to a power running operation;
a frequency spectrum analysis unit configured to generate a frequency spectrum based on the physical quantity detected by the sensor detected during the power running operation of the power conversion unit;
a frequency component extraction unit configured to extract a component of a specific frequency band related to a frequency depending on a configuration of the power conversion unit on the basis of the frequency spectrum; and
a diagnosis processing unit configured to diagnose a state of the capacitor on the basis of at least a magnitude of the extracted component of the specific frequency band,
wherein the capacitor comprises a first capacitor unit and a second capacitor unit connected in parallel,
wherein the sensor comprises a first electric current sensor configured to detect an electric current flowing through the first capacitor unit but not through the second capacitor unit,
wherein the frequency spectrum analysis unit comprises a first frequency spectrum analysis unit configured to generate a first frequency spectrum based on a detection result of the first electric current sensor detected during the power running operation of the power conversion unit,
wherein the frequency spectrum comprises the first frequency spectrum,
wherein the frequency component extraction unit extracts an electric current component of the specific frequency band as the component of the specific frequency band on the basis of the first frequency spectrum, and
wherein the diagnosis processing unit diagnoses a state of the first capacitor unit on the basis of at least a magnitude of the extracted electric current component of the specific frequency band.

2. The capacitor diagnosis device according to claim 1,
wherein the power conversion unit comprises a switching device configured to be controlled according to pulse width modulation (PWM) control using a carrier signal having a fixed carrier frequency and therefore perform switching when the DC power is converted into the AC power, and
wherein the frequency component extraction unit extracts an electric current component of a defined frequency band based on a frequency that is an integral multiple of the carrier frequency as an electric current component of the specific frequency band on the basis of the generated first frequency spectrum.

3. The capacitor diagnosis device according to claim 2,
wherein the frequency component extraction unit extracts a magnitude of the electric current component of the specific frequency band determined on the basis of the carrier frequency.

4. A capacitor diagnosis device comprising:
a sensor configured to detect a physical quantity that changes with an electric current flowing through a capacitor in a power conversion unit for converting direct current (DC) power smoothed by the capacitor connected in parallel to a DC link into alternating current (AC) power according to a power running operation;
a frequency spectrum analysis unit configured to generate a frequency spectrum based on the physical quantity detected by the sensor detected during the power running operation of the power conversion unit;
a frequency component extraction unit configured to extract a component of a specific frequency band related to a frequency depending on a configuration of the power conversion unit on the basis of the frequency spectrum; and
a diagnosis processing unit configured to diagnose a state of the capacitor on the basis of at least a magnitude of the extracted component of the specific frequency band,
wherein the capacitor comprises a first capacitor unit and a second capacitor unit,
wherein the sensor comprises a first electric current sensor configured to detect an electric current flowing through the first capacitor unit,
wherein the frequency spectrum analysis unit comprises a first frequency spectrum analysis unit configured to generate a first frequency spectrum based on a detection result of the first electric current sensor detected during the power running operation of the power conversion unit,
wherein the frequency spectrum comprises the first frequency spectrum,
wherein the frequency component extraction unit extracts an electric current component of the specific frequency band as the component of the specific frequency band on the basis of the first frequency spectrum,
wherein the diagnosis processing unit diagnoses a state of the first capacitor unit on the basis of at least a magnitude of the extracted electric current component of the specific frequency band,
wherein a determination criterion of the diagnosis processing unit is defined on the basis of a relationship between the magnitude of the electric current component of the specific frequency band and a deterioration situation of the capacitor, and
wherein the diagnosis processing unit determines the magnitude of the extracted electric current component of the specific frequency band on the basis of the determination criterion and diagnoses a state of the first capacitor unit on the basis of a result of the determination.

5. A capacitor diagnosis device comprising:
a sensor configured to detect a physical quantity that changes with an electric current flowing through a capacitor in a power conversion unit for converting direct current (DC) power smoothed by the capacitor connected in parallel to a DC link into alternating current (AC) power according to a power running operation;
a frequency spectrum analysis unit configured to generate a frequency spectrum based on the physical quantity detected by the sensor detected during the power running operation of the power conversion unit;
a frequency component extraction unit configured to extract a component of a specific frequency band related to a frequency depending on a configuration of the power conversion unit on the basis of the frequency spectrum; and a diagnosis processing unit configured to diagnose a state of the capacitor on the basis of at least a magnitude of the extracted component of the specific frequency band, wherein the capacitor comprises a first capacitor unit and a second capacitor unit, wherein the sensor comprises a first electric current sensor configured to detect an electric current flowing through the first capacitor unit, wherein the frequency spectrum analysis unit comprises a first frequency spectrum analysis unit configured to generate a first frequency spectrum based on a detection result of the first electric current sensor detected during the power running operation of the power conversion unit, wherein the frequency spectrum comprises the first frequency spectrum, wherein the frequency component extraction unit extracts an electric current component of the specific frequency band as the component of the specific frequency band on the basis of the first frequency spectrum, wherein the diagnosis processing unit diagnoses a state of the first capacitor unit on the basis of at least a magnitude of the extracted electric current component of the specific frequency band, wherein a branch path from a first electrode of the DC link and a first branch path and a second branch path further branching from the branch path are formed, wherein a first electrode terminal of the first capacitor unit is connected to the first branch path and a second electrode terminal of the first capacitor unit is connected to a second electrode of the DC link, wherein a first electrode terminal of the second capacitor unit is connected to the second branch path and a second electrode terminal of the second capacitor unit is connected to the second electrode of the DC link, wherein the first electric current sensor detects an electric current flowing through the first branch path, wherein the sensor includes a second electric current sensor configured to detect an electric current flowing through the second branch path, wherein the first frequency spectrum analysis unit generates a second frequency spectrum based on a detection result of the second electric current sensor detected during the power running operation of the power conversion unit, wherein the frequency component extraction unit extracts an electric current component of the specific frequency band on the basis of the second frequency spectrum, and wherein the diagnosis processing unit diagnoses a state of the second capacitor unit on the basis of a magnitude of the electric current component of the specific frequency band extracted on the basis of the second frequency spectrum.

6. A capacitor diagnosis device comprising:

a sensor configured to detect a physical quantity that changes with an electric current flowing through a capacitor in a power conversion unit for converting direct current (DC) power smoothed by the capacitor connected in parallel to a DC link into alternating current (AC) power according to a power running operation;

a frequency spectrum analysis unit configured to generate a frequency spectrum based on the physical quantity detected by the sensor detected during the power running operation of the power conversion unit;

a frequency component extraction unit configured to extract a component of a specific frequency band related to a frequency depending on a configuration of the power conversion unit on the basis of the frequency spectrum; and a diagnosis processing unit configured to diagnose a state of the capacitor on the basis of at least a magnitude of the extracted component of the specific frequency band, wherein the sensor comprises a first voltage sensor configured to detect a voltage of the DC link, wherein the frequency spectrum analysis unit comprises a third frequency spectrum analysis unit configured to generate a third frequency spectrum based on a detection result of the first voltage sensor detected during the power running operation of the power conversion unit, wherein the frequency spectrum comprises the third frequency spectrum, wherein the frequency component extraction unit extracts a voltage component of the specific frequency band as the component of the specific frequency band on the basis of the third frequency spectrum, and wherein the diagnosis processing unit diagnoses the state of the capacitor on the basis of at least a magnitude of the extracted voltage component of the specific frequency band.

7. The capacitor diagnosis device according to claim 6, wherein the power conversion unit comprises a switching device configured to be controlled according to PWM control using a carrier signal having a fixed carrier frequency and therefore convert the DC power into the AC power, and wherein the frequency component extraction unit extracts an electric current component of a defined frequency band based on a frequency that is an integral multiple of the carrier frequency as an electric current component of the specific frequency band on the basis of the generated third frequency spectrum.

8. The capacitor diagnosis device according to claim 7, wherein the frequency component extraction unit extracts a magnitude of the voltage component of the specific frequency band determined on the basis of the carrier frequency.

9. The capacitor diagnosis device according to claim 8, wherein a determination criterion of the diagnosis processing unit is defined on the basis of a relationship between the magnitude of the electric current component of the specific frequency band and a deterioration situation of the capacitor, and wherein the diagnosis processing unit determines the magnitude of the extracted electric current component of the specific frequency band on the basis of the determination criterion and diagnoses a state of the capacitor on the basis of a result of the determination.

10. The capacitor diagnosis device according to claim 6, comprising a second electric current sensor configured to detect an alternating current flowing from the power conversion unit to a load, wherein the diagnosis processing unit diagnoses a state of the capacitor on the basis of at least a magnitude of the extracted component of the specific frequency band and a detected value of the alternating current.

11. The capacitor diagnosis device according to claim 10,
wherein a determination criterion of the diagnosis processing unit is defined on the basis of relationships between a magnitude of an electric current flowing from the power conversion unit to the load, a magnitude of the voltage component of the specific frequency band, and a deterioration situation of the capacitor, and
wherein the diagnosis processing unit determines a magnitude of the extracted voltage component of the specific frequency band on the basis of the determination criterion and diagnoses the state of the capacitor on the basis of a result of the determination.

12. A capacitor diagnosis method comprising:
detecting, by a sensor, a physical quantity that changes with an electric current flowing through a capacitor in a power conversion unit for converting DC power smoothed by the capacitor connected in parallel to a DC link into AC power according to a power running operation;
generating a frequency spectrum based on the physical quantity detected by the sensor detected during the power running operation of the power conversion unit;
extracting a component of a specific frequency band related to a frequency depending on a configuration of the power conversion unit on the basis of the frequency spectrum; and
diagnosing a state of the capacitor on the basis of at least a magnitude of the extracted component of the specific frequency band,
wherein the capacitor comprises a first capacitor unit and a second capacitor unit,
wherein the sensor comprises a first electric current sensor configured to detect an electric current flowing through the first capacitor unit,
wherein the generating further comprises generating a first frequency spectrum based on a detection result of the first electric current sensor detected during the power running operation of the power conversion unit,
wherein the frequency spectrum comprises the first frequency spectrum,
wherein the extracting extracts an electric current component of the specific frequency band as the component of the specific frequency band on the basis of the first frequency spectrum, and
wherein the diagnosing diagnoses a state of the first capacitor unit on the basis of at least a magnitude of the extracted electric current component of the specific frequency band,
wherein a determination criterion of the diagnosing is defined on the basis of a relationship between the magnitude of the electric current component of the specific frequency band and a deterioration situation of the capacitor, and
wherein the diagnosing determines the magnitude of the extracted electric current component of the specific frequency band on the basis of the determination criterion and diagnoses a state of the first capacitor unit on the basis of a result of the determination.

13. A capacitor diagnosis method comprising:
detecting, by a sensor, a physical quantity that changes with an electric current flowing through a capacitor in a power conversion unit for converting direct current (DC) power smoothed by the capacitor connected in parallel to a DC link into alternating current (AC) power according to a power running operation;
generating a frequency spectrum based on the physical quantity detected by the sensor detected during the power running operation of the power conversion unit;
extracting a component of a specific frequency band related to a frequency depending on a configuration of the power conversion unit on the basis of the frequency spectrum; and
diagnosing a state of the capacitor on the basis of at least a magnitude of the extracted component of the specific frequency band,
wherein the capacitor comprises a first capacitor unit and a second capacitor unit,
wherein the sensor comprises a first electric current sensor configured to detect an electric current flowing through the first capacitor unit,
wherein the generating includes generating a first frequency spectrum based on a detection result of the first electric current sensor detected during the power running operation of the power conversion unit,
wherein the frequency spectrum comprises the first frequency spectrum,
wherein the extracting includes extracting an electric current component of the specific frequency band as the component of the specific frequency band on the basis of the first frequency spectrum, and
wherein the diagnosing includes diagnosing a state of the first capacitor unit on the basis of at least a magnitude of the extracted electric current component of the specific frequency band,
wherein a branch path from a first electrode of the DC link and a first branch path and a second branch path further branching from the branch path are formed,
wherein a first electrode terminal of the first capacitor unit is connected to the first branch path and a second electrode terminal of the first capacitor unit is connected to a second electrode of the DC link,
wherein a first electrode terminal of the second capacitor unit is connected to the second branch path and a second electrode terminal of the second capacitor unit is connected to the second electrode of the DC link,
wherein the first electric current sensor detects an electric current flowing through the first branch path,
wherein the sensor includes a second electric current sensor configured to detect an electric current flowing through the second branch path,
wherein the generating includes generating a second frequency spectrum based on a detection result of the second electric current sensor detected during the power running operation of the power conversion unit,
wherein the extracting includes extracting an electric current component of the specific frequency band on the basis of the second frequency spectrum, and
wherein the diagnosing includes diagnosing a state of the second capacitor unit on the basis of a magnitude of the electric current component of the specific frequency band extracted on the basis of the second frequency spectrum.

14. A capacitor diagnosis method comprising:
detecting, by a sensor, a physical quantity that changes with an electric current flowing through a capacitor in a power conversion unit for converting direct current (DC) power smoothed by the capacitor connected in parallel to a DC link into alternating current (AC) power according to a power running operation;
generating a frequency spectrum based on the physical quantity detected by the sensor detected during the power running operation of the power conversion unit;

extracting a component of a specific frequency band related to a frequency depending on a configuration of the power conversion unit on the basis of the frequency spectrum; and diagnosing a state of the capacitor on the basis of at least a magnitude of the extracted component of the specific frequency band, wherein the sensor comprises a first voltage sensor configured to detect a voltage of the DC link, wherein the generating further includes generating a third frequency spectrum based on a detection result of the first voltage sensor detected during the power running operation of the power conversion unit, wherein the frequency spectrum comprises the third frequency spectrum, wherein the extracting further includes extracting a voltage component of the specific frequency band as the component of the specific frequency band on the basis of the third frequency spectrum, and wherein the diagnosing further comprises diagnosing the state of the capacitor on the basis of at least a magnitude of the extracted voltage component of the specific frequency band.

* * * * *